United States Patent
Park et al.

(10) Patent No.: US 12,289,966 B2
(45) Date of Patent: Apr. 29, 2025

(54) DISPLAY APPARATUS AND METHOD OF MANUFACTURING DISPLAY APPARATUS

(71) Applicant: Samsung Display Co., Ltd., Yongin-si (KR)

(72) Inventors: Chan-Jae Park, Suwon-si (KR); Kikyung Youk, Bucheon-si (KR); Sangduk Lee, Yongin-si (KR); Hyun A Lee, Seoul (KR); Daehyuk Im, Daegu (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 515 days.

(21) Appl. No.: 17/624,223

(22) PCT Filed: Mar. 5, 2020

(86) PCT No.: PCT/KR2020/095020
§ 371 (c)(1),
(2) Date: Dec. 30, 2021

(87) PCT Pub. No.: WO2021/002738
PCT Pub. Date: Jan. 7, 2021

(65) Prior Publication Data
US 2022/0352290 A1   Nov. 3, 2022

(30) Foreign Application Priority Data
Jul. 3, 2019   (KR) .................. 10-2019-0080130

(51) Int. Cl.
*H10K 59/40*    (2023.01)
*G02F 1/1345*   (2006.01)
(Continued)

(52) U.S. Cl.
CPC ............ *H10K 59/131* (2023.02); *H10K 59/40* (2023.02); *H10K 71/00* (2023.02); *H10K 59/1201* (2023.02)

(58) Field of Classification Search
CPC ......... H01L 24/17; H01L 24/32; H01L 24/73; H01L 24/81; H01L 24/83;
(Continued)

(56) References Cited

U.S. PATENT DOCUMENTS

| 5,679,493 A | 10/1997 | Kai |
| 5,717,476 A | 2/1998 | Kanezawa |

(Continued)

FOREIGN PATENT DOCUMENTS

| CN | 102122481 A | 7/2011 |
| CN | 103187430 A | 7/2013 |

(Continued)

OTHER PUBLICATIONS

Robert Brooke et al., "Controlling the electrochromic properties of conductive polymers using UV-light", J. Mater Chem. C, 2018, pp. 4663-4670, vol. 6, Royal Society of Chemistry.

(Continued)

*Primary Examiner* — Sonya McCall-Shepard
(74) *Attorney, Agent, or Firm* — CANTOR COLBURN LLP

(57) ABSTRACT

A display apparatus includes a display panel having a display region and a non-display region and including a plurality of panel pads disposed in the non-display region, a flexible circuit board including a plurality of connection pads overlapping the plurality of panel pads, and a bonding layer disposed between the display panel and the flexible circuit board and including a conductive polymer, wherein the bonding layer includes a plurality of conductive portions overlapping the plurality of panel pads and the plurality of (Continued)

connection pads and having a first conductivity value, and a plurality of non-conductive portions not overlapping the plurality of panel pads and the plurality of connection pads and having a second conductivity value smaller than the first conductivity value.

20 Claims, 19 Drawing Sheets

(51) Int. Cl.
  *H05K 3/32* (2006.01)
  *H10K 59/131* (2023.01)
  *H10K 71/00* (2023.01)
  *H10K 85/10* (2023.01)
  *H10K 59/12* (2023.01)

(58) Field of Classification Search
  CPC . H01L 2224/16227; H01L 2224/16238; H01L 2224/73204; H01L 24/29; H01L 24/11; H01L 24/13; H01L 24/16; H01L 2224/32227; H01L 21/76841; H01L 21/76853; H01L 21/76862; H01L 27/14678; H01L 2224/81193; H01L 2224/81201; H01L 2224/83007; H01L 2224/83201; H01L 2224/92125; H01L 2224/81203; H01L 24/14; H05K 1/144; H05K 1/028; H05K 1/111; H05K 1/147; H05K 2201/042; H05K 2201/10128; H05K 2201/2036; H05K 2203/0278; H05K 3/323
  See application file for complete search history.

(56) References Cited

U.S. PATENT DOCUMENTS

| | | | |
|---|---|---|---|
| 8,643,016 B2 | 2/2014 | Park et al. | |
| 8,648,824 B2 | 2/2014 | Lee | |
| 9,839,144 B2 | 12/2017 | Chuang et al. | |
| 9,864,242 B2 | 1/2018 | Lee | |
| 9,904,432 B2 | 2/2018 | Choi et al. | |
| 9,994,743 B2 | 6/2018 | Aoki et al. | |
| 10,178,769 B2 | 1/2019 | Min et al. | |
| 10,326,101 B2 | 6/2019 | Oh et al. | |
| 10,847,742 B2 | 11/2020 | Kim et al. | |
| 2018/0092209 A1* | 3/2018 | Han | H05K 1/09 |
| 2018/0352654 A1* | 12/2018 | Fassler | H05K 3/323 |

FOREIGN PATENT DOCUMENTS

| | | | | |
|---|---|---|---|---|
| CN | 203377205 | * | 1/2014 | H01L 21/683 |
| CN | 104570423 A | | 4/2015 | |
| CN | 106009015 A | | 10/2016 | |
| CN | 107540797 A | | 1/2018 | |
| CN | 107785690 A | | 3/2018 | |
| CN | 107887524 A | | 4/2018 | |
| CN | 108257509 A | | 7/2018 | |
| KR | 960011504 A | | 4/1996 | |
| KR | 960029850 A | | 8/1996 | |
| KR | 20-0401912 | | 11/2005 | |
| KR | 2005015662 A | * | 11/2005 | G02F 1/1345 |
| KR | 1020050105662 A | | 11/2005 | |
| KR | 1020070113058 A | | 11/2007 | |
| KR | 1020120053678 A | | 5/2012 | |
| KR | 101455239 B1 | | 10/2014 | |
| KR | 10-2015-0146371 | | 12/2015 | |
| KR | 10-2016-0122888 | | 10/2016 | |
| KR | 10-2018-0024099 | | 3/2018 | |
| KR | 10-2018-0077409 | | 7/2018 | |
| WO | 2014/081064 | | 5/2014 | |

OTHER PUBLICATIONS

Jesper Edberg et al., "Patterning and Conductivity Modulation of Conductive Polymers by UV Light Exposure", Advanced Functional Materials, 6950-6960, vol. 26, Wileyonlinelibrary.

* cited by examiner

DISPLAY APPARATUS AND METHOD OF MANUFACTURING DISPLAY APPARATUS

CROSS REFERENCE TO RELATED APPLICATION

This application is a National Stage Entry of International Application No. PCT/KR2020/095020, filed Mar. 5, 2020, and claims priority from and the benefit of Korean Patent Application No. 10-2019-0080130, filed on Jul. 3, 2019, each of which are hereby incorporated by reference for all purposes as if fully set forth herein.

BACKGROUND

Field

Embodiments relate generally to a display apparatus and a method of manufacturing a display apparatus and more specifically, to a display apparatus including a conductive polymer bonding layer configured to bond a display panel and a circuit board and a method of manufacturing the display apparatus.

Discussion of the Background

An electronic device such as a display device includes a plurality of circuit lines and a plurality of electronic elements connected thereto, and is operated according to an electrical signal. In order to electrically connect the plurality of circuit lines and the plurality of electronic elements, a conductive bonding member has been used. For example, an anisotropic conductive film (ACF) and the like have been used to electrically connect a display panel and a circuit board of the display device, and the like.

Meanwhile, as high resolution is required in the display device, a bonding member for bonding with high-definition circuit lines is required.

The above information disclosed in this Background section is only for understanding of the background of the inventive concepts, and, therefore, it may contain information that does not constitute prior art.

SUMMARY

Display apparatuses constructed according to the principles of the invention are capable of improving reliability thereof by providing a bonding layer including a conductive portion and a non-conductive portion, which have different conductivity, to the display apparatuses.

Methods of manufacturing the display apparatuses according to the principles of the invention are capable of improving reliability by performing a step of forming a bonding layer to have a conductive portion and a non-conductive portion which have different conductivity.

Additional features of the inventive concepts will be set forth in the description which follows, and in part will be apparent from the description, or may be learned by practice of the inventive concepts.

According to an aspect of the invention, a display apparatus includes a display panel having a display region and a non-display region and including a plurality of panel pads disposed in the non-display region, a flexible circuit board including a plurality of connection pads overlapping the plurality of panel pads, and a bonding layer disposed between the display panel and the flexible circuit board and including a conductive polymer, wherein the bonding layer includes a plurality of conductive portions overlapping the plurality of panel pads and the plurality of connection pads and having a first conductivity value, and a plurality of non-conductive portions not overlapping the plurality of panel pads and the plurality of connection pads and having a second conductivity value smaller than the first conductivity value.

The first conductivity value and the second conductivity value may satisfy an equation as below.

$$\text{(First conductivity value)/(Second conductivity value)} \geq 100.$$

The conductive polymer may include at least one among polythiophene, poly(3,4-ethylenedioxythiophene), polyaniline, polyacetylene, polydiacetylene, poly(thiophenevinylene), polyfluorene, and polypyrrol.

The conductive polymer may include at least one among poly(3,4-ethylenedioxythiophene):polystyrenesulfonate, poly(3,4-ethylenedioxythiophene):camphor sulfonic acid, poly(3,4-ethylenedioxythiophene):toluene sulfonic acid, poly(3,4-ethylenedioxythiophene): dodecyl benzene sulfonic acid, polyaniline:polystyrenesulfonate, polyaniline: camphor sulfonic acid, polypyrrol:polystyrenesulfonate, polypyrrol:camphor sulfonic acid, polypyrrol:toluene sulfonic acid, polypyrrol:dodecyl benzene sulfonic acid, polythiophene:polystyrenesulfonate, polythiophene:camphor sulfonic acid, polythiophene:toluene sulfonic acid, and polythiophene:dodecyl benzene sulfonic acid.

A weight average molecular weight of the conductive polymer in the plurality of conductive portions may be larger than a weight average molecular weight of the conductive polymer in the plurality of non-conductive portions.

The display apparatus may further include an input sensing unit disposed on the display panel and including a sensing region and a non-sensing region neighboring the sensing region, wherein the input sensing unit may include a plurality of sensing pads disposed in the non-sensing region.

The display apparatus may further include a sensing flexible circuit board including a plurality of sensing connection pads overlapping the plurality of sensing pads, and a sensing bonding layer disposed between the input sensing unit and the sensing flexible circuit board and including the conductive polymer, wherein the sensing bonding layer may include a plurality of sensing conductive portions overlapping the plurality of sensing pads and the plurality of sensing connection pads, and a plurality of sensing non-conductive portions not overlapping the plurality of sensing pads and the plurality of sensing connection pads and having a smaller conductivity value than the plurality of sensing conductive portions.

A ratio of the conductivity value of the plurality of sensing non-conductive portions to the conductivity value of the plurality of sensing conductive portions may be about 100 or greater.

The display apparatus may further include an auxiliary bonding layer disposed at an edge of the bonding layer.

The thickness of each conductive portion may be less than the thickness of each non-conductive portion.

According to another aspect of the invention, a display apparatus includes a display panel including a base substrate and a plurality of panel pads disposed on one surface of the base substrate, a flexible circuit board including a base film and a plurality of connection pads disposed on one surface of the base film and overlapping the plurality of panel pads, and a bonding layer disposed between the display panel and the flexible circuit board and including a conductive polymer, wherein the bonding layer may include a plurality of conductive portions electrically connecting the plurality of panel pads and the plurality of connection pads, and a plurality of non-conductive portions disposed between the plurality of conductive portions.

A first conductivity value of each of the plurality of conductive portions and a second conductivity value of each of the plurality of non-conductive portions may satisfy an equation as below.

(First conductivity value)/(Second conductivity value)≥100.

The plurality of conductive portions may overlap the plurality of panel pads and the plurality of connection pads overlapping the plurality of panel pads, and the plurality of non-conductive portions may not overlap the plurality of panel pads and the plurality of connection pads.

The plurality of non-conductive portions may fill between the base substrate and the base film.

According to another aspect of the invention, a method of manufacturing a display apparatus includes the steps of: providing a display panel including a base substrate and a plurality of panel pads disposed on one surface of the base substrate, providing a preliminary bonding layer covering the plurality of panel pads on the base substrate, forming a bonding layer including a conductive portion and a non-conductive portion with irradiating the preliminary bonding layer with a first light, and disposing a flexible circuit board including a plurality of connection pads on the display panel. The conductive portion may overlap the plurality of panel pads and the plurality of connection pads overlapping the plurality of panel pads and have a first conductivity value, and the non-conductive portion may not overlap the plurality of panel pads and the plurality of connection pads and have a second conductivity value smaller than the first conductivity value.

The first light may pass through the base substrate using the plurality of panel pads as a mask and be provided to the preliminary bonding layer.

The first light may have a center wavelength of about 250 nm to about 450 nm.

The bonding layer may include a conductive polymer including at least one among polythiophene, poly(3,4-ethylenedioxythiophene), polyaniline, polyacetylene, polydiacetylene, poly(thiophenevinylene), polyfluorene, and polypyrrol.

The step of disposing of the flexible circuit board and the step of forming the bonding layer may be sequentially performed.

The method may further include the step of disposing an auxiliary bonding layer at an edge of the bonding layer after the step of forming of a bonding layer.

A display apparatus according to an embodiment includes a conductive polymer and a bonding layer patterned with a conductive portion and a non-conductive portion, and thus, may have improved reliability properties.

A method of manufacturing a display apparatus according to an embodiment patterns a preliminary bonding layer provided between a display panel and a circuit board to form a bonding layer including a conductive portion and a non-conductive portion, and thus, may provide a display apparatus having excellent reliability even when the display apparatus is implemented to have a high resolution.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
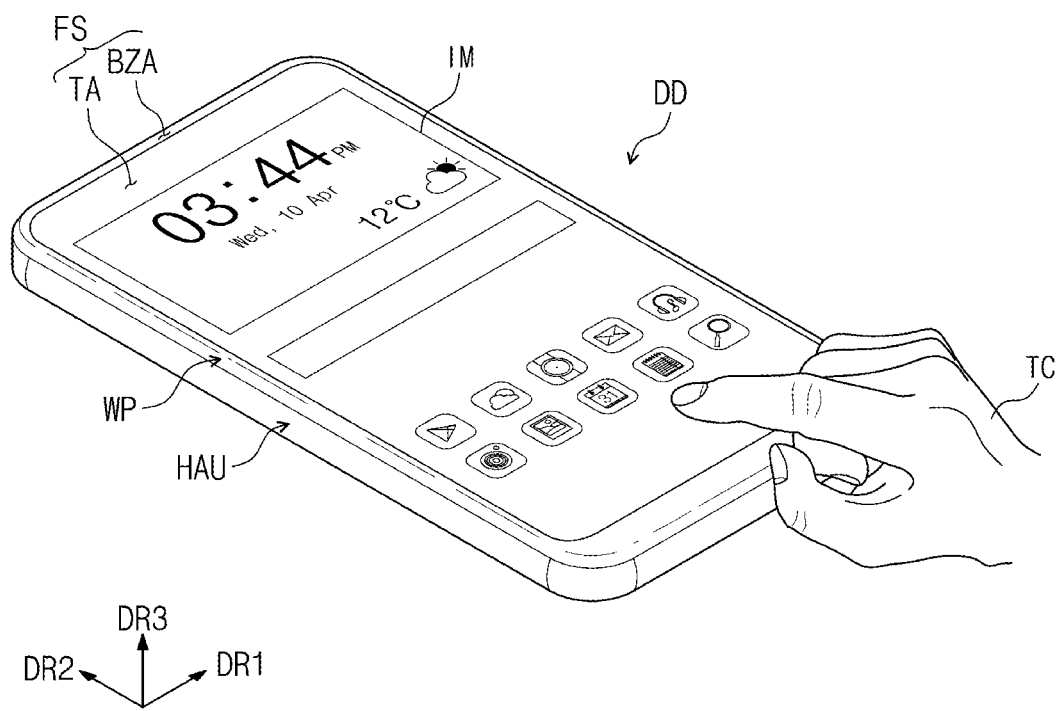
FIG. 1 is a perspective view of an embodiment of a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like is reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display apparatus according to an embodiment and a method of manufacturing an embodiment of a display apparatus will be described with reference to the accompanying drawings.

Figure 2:
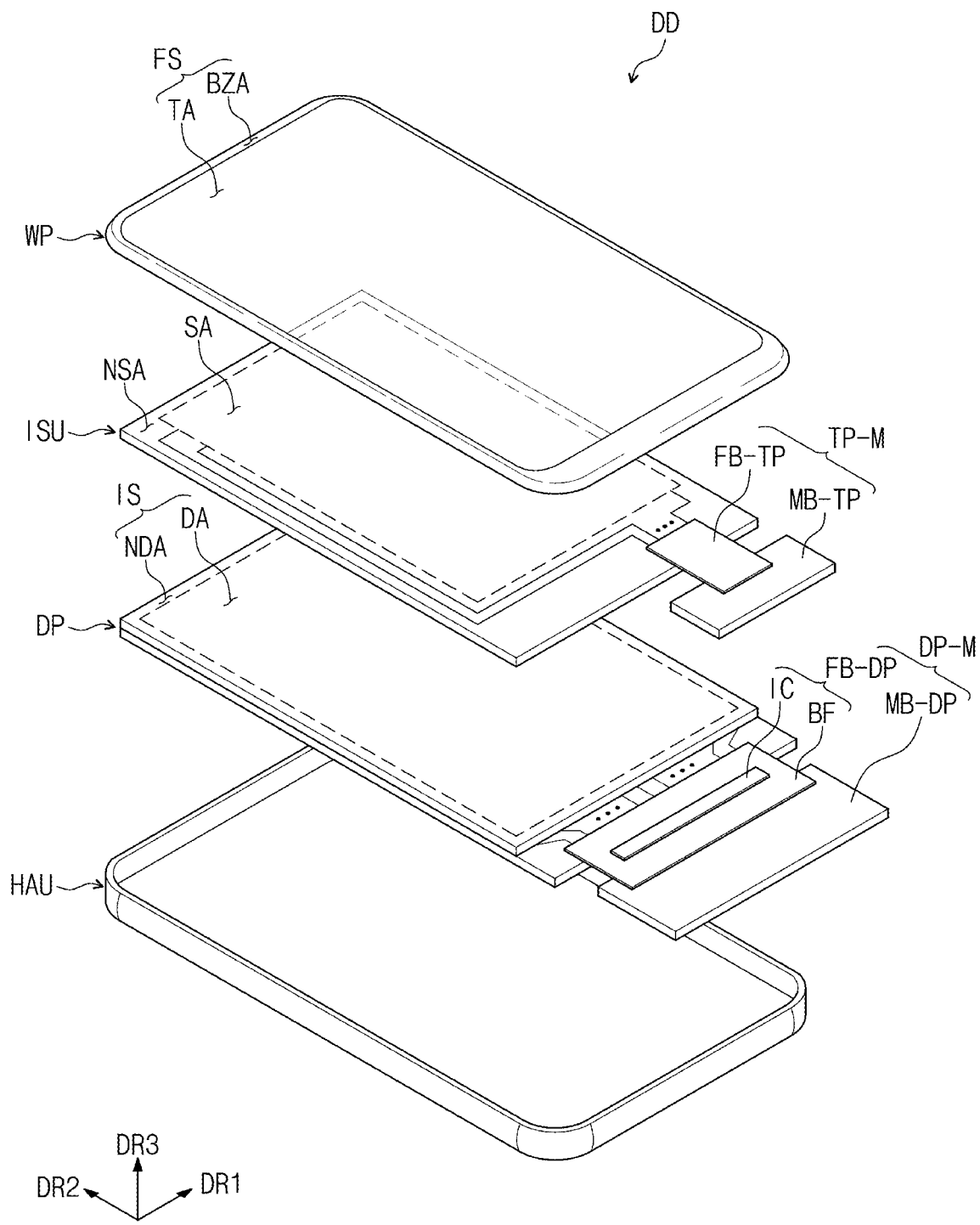
FIG. 2 is an exploded perspective view of the display apparatus of FIG. 1.
Figure 3:
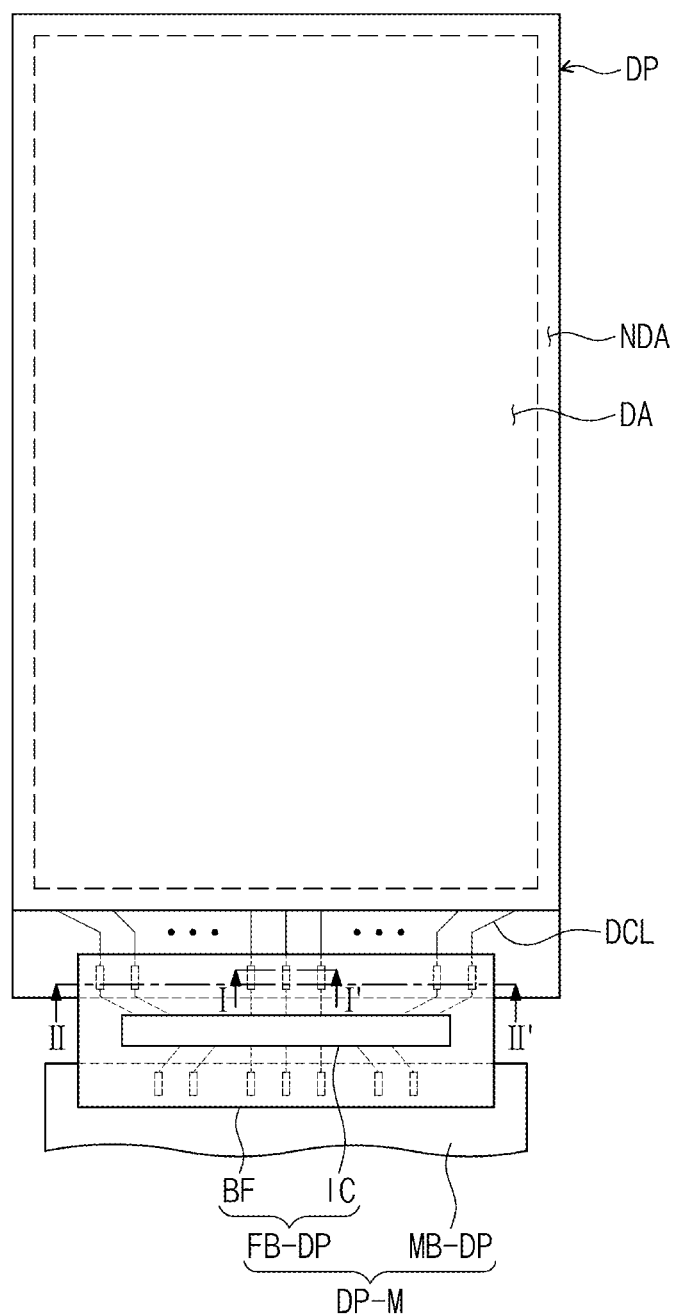
FIG. 3 is a plan view of a portion of the display apparatus of FIG. 1.
Figure 4:
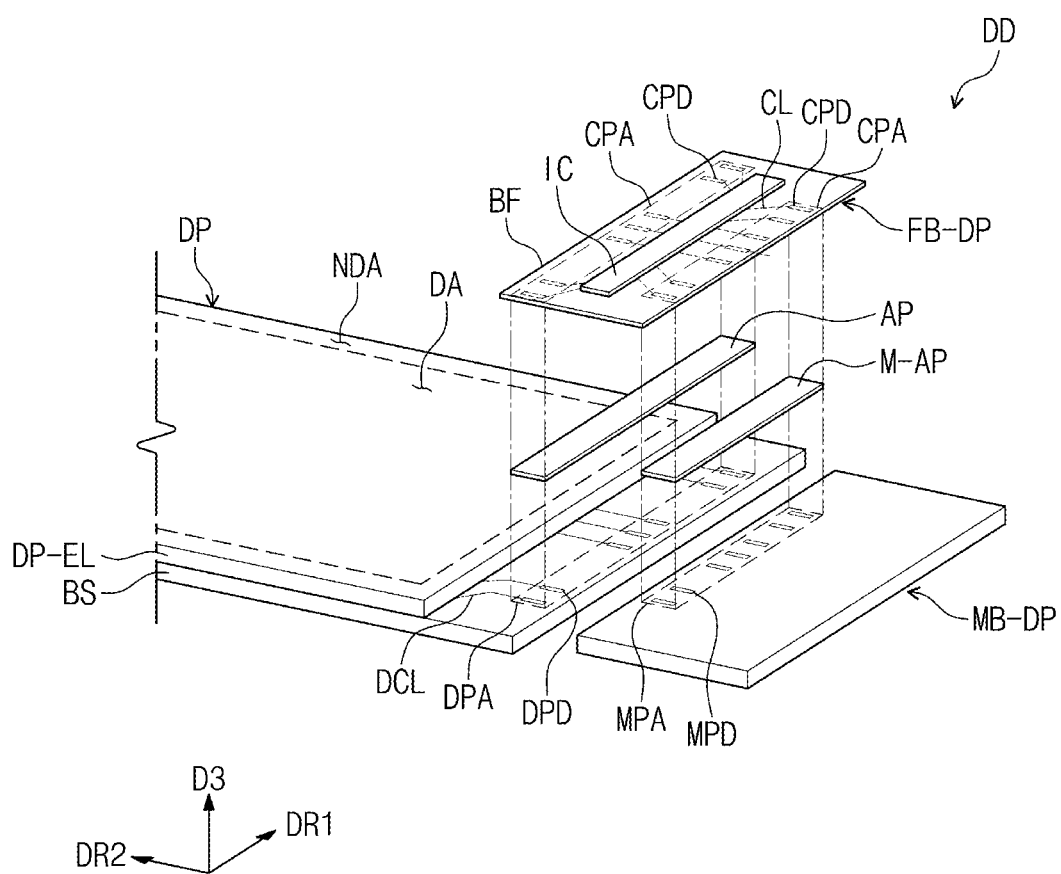
FIG. 4 is an exploded perspective view of a portion of the display apparatus of FIG. 1.
Figure 5:
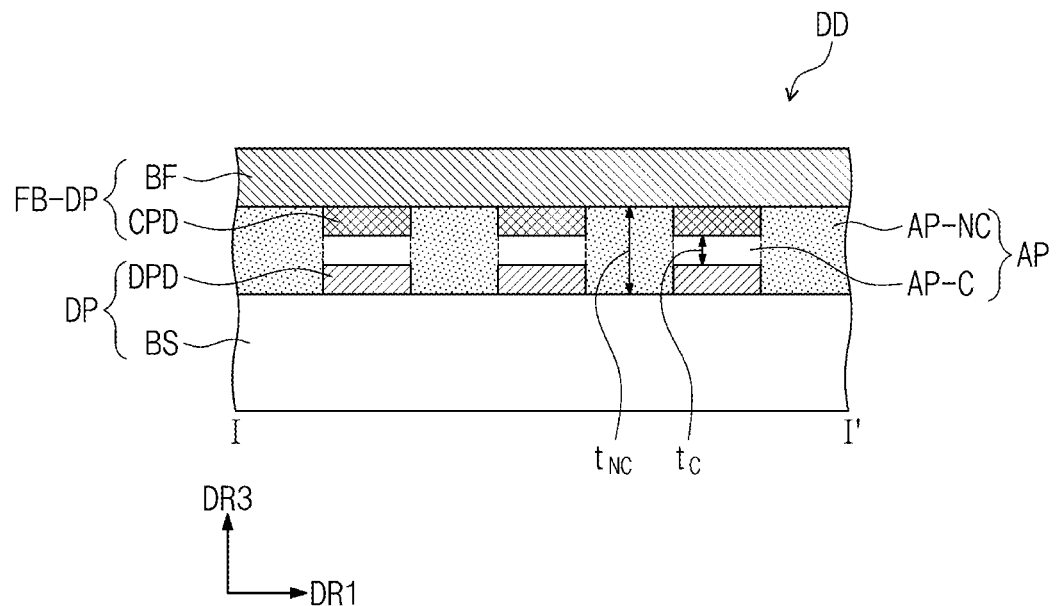
FIG. 5 is a cross-sectional view taken along lines I-I' of FIG. 3 showing a portion of a display apparatus according to an embodiment.
Figure 6:
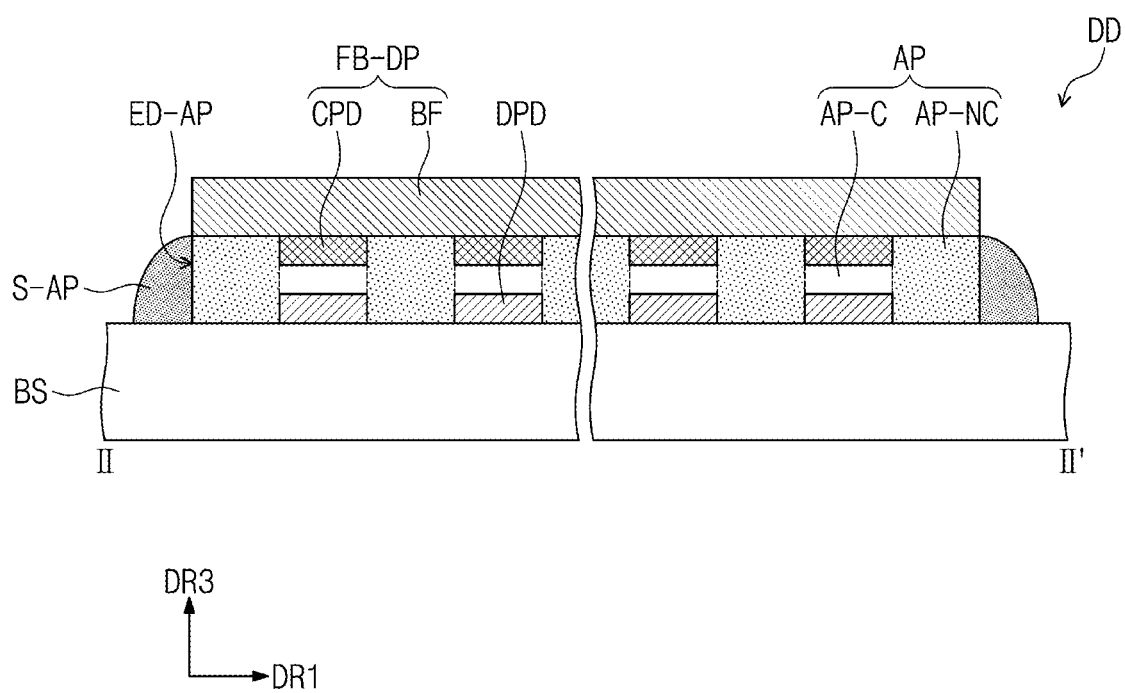
FIG. 6 is a cross-sectional view taken along line I-I' of FIG. 3 showing a portion of a display apparatus according to another embodiment.

FIG. 1 is a perspective view of an embodiment of a display apparatus. FIG. 2 is an exploded perspective view of the display apparatus of FIG. 1. FIG. 3 is a plan view of a portion of a display apparatus according to an embodiment. FIG. 4 is an exploded perspective view of a portion of the display apparatus of FIG. 1, and FIG. 5 and FIG. 6 are each a cross-sectional view showing a portion of an embodiment of a display apparatus. FIG. 5 is a cross-sectional view of a portion corresponding to line I-I' of FIG. 3, and FIG. 6 is a cross-sectional view of a portion corresponding to line II-IF of FIG. 3.

A display apparatus DD may be an apparatus activated by an electrical signal. The display apparatus DD may include various embodiments. For example, the display apparatus DD may include a personal computer, a notebook computer, a personal digital terminal, a car navigation system unit, a game console, a smart phone, a tablet computer, or a camera, and the like. However, embodiments are not limited thereto, and may be implemented as various display apparatuses. In the descriptions, the display apparatus DD is exemplarily illustrated as a smart phone.

In FIG. 1 and the following drawings, a first axis direction DR1, a second axis direction DR2, and a third axis direction DR3 are illustrated. The first, second, and third axis directions DR1, DR2, and DR3 described in the descriptions are a relative concept, and may be converted to different directions.

In the descriptions, for convenience of description, the third axis direction DR3 is defined as a direction in which an image is displayed to a user. Also, the first axis direction DR1 and a second axis direction DR2 are perpendicular to each other, and the third axis direction DR3 may be a normal direction with respect to a plane defined by the first axis direction DR1 and the second axis direction DR2.

The display apparatus DD according to an embodiment may include a display panel DP, a panel driving unit DP-M, and a bonding layer AP. In addition, the display apparatus DD according to an embodiment may further include an input sensing unit ISU and a sensing driving unit TP-M. The display apparatus DD according to an embodiment includes a window WP and a housing HAU, and the window WP and the housing HAU may be coupled to configure the appearance of the display apparatus DD.

For example, in the display apparatus DD according to another embodiment, the input sensing unit ISU and the sensing driving unit TP-M may be omitted. In addition, the input sensing unit ISU may be directly disposed on the display panel DP to be provided as one body with the display panel DP.

In an embodiment, the display apparatus DD may display an image IM toward the third axis direction DR3 on a display surface FS parallel to the plane defined by the first axis direction DR1 and the second axis direction DR2. The display surface FS on which the image IM is displayed may correspond to a front surface of the display apparatus DD, and may correspond to a front surface FS of the window WP. Hereinafter, the same reference numeral will be used for the display surface and the front surface of the display apparatus DD, and for the front surface of the window WP. The image IM may include a moving image and also a still image. In FIG. 1, as an example of the image IM, a watch window and application icons are illustrated.

In the display apparatus DD according to an embodiment, the window WP may include an optically transparent insulation material. The window WP may include a transmission region TA and a bezel region BZA. The front surface FS of the window WP including the transmission region TA and the bezel region BZA corresponds to the front surface FS of the display apparatus DD. A user may visually recognize an image provided through the transmission region TA corresponding to the front surface FS of the display apparatus DD.

In FIG. 1, the transmission region TA is illustrated as a quadrangular shape having rounded vertices. However, embodiments are not limited thereto. For example, the transmission region TA may have various shapes.

The transmission region TA may be an optically transparent region. The bezel region BZA may be a region having a relatively low light transmittance compared to the transmission region TA. The bezel region BZA may have a predetermined color. The bezel region BZA is adjacent to the transmission region TA, and may surround the transmission region TA. The bezel region BZA may define the shape of the transmission region TA. However, the embodiments are not limited thereto. For example, the bezel region BZA may be disposed adjacent to only one side of the transmission region TA, or a portion thereof may be omitted.

The display panel DP may be disposed below the window WP. In the descriptions, the term "below" may mean a direction opposite to a direction in which the display panel DP displays an image.

In an embodiment, the display panel DP may be a component which substantially generates the image IM. The image IM generated by the display panel DP is displayed on a display surface IS, and is visually recognized by a user from the outside through the transmission region TA.

In the display apparatus DD according to an embodiment, the display panel DP may be implemented as a liquid crystal display panel or an emission-type display panel. For example, the display panel DP may be a liquid crystal display panel including a liquid crystal element, an organic electroluminescence display panel including an organic electroluminescence element, or a quantum dot light emission display panel including a quantum dot light emission element. However, embodiments are not limited thereto.

The display panel DP may include a display region DA and a non-display region NDA. In an embodiment, a liquid crystal element, an organic electroluminescence element, a quantum dot light emission element, or the like may be disposed in the display region DA of the display panel DP.

The display panel DP may include the display surface IS including the display region DA and the non-display region NDA. The display region DA may be a region activated according to an electrical signal. The non-display region NDA may be a region covered by the bezel region BZA. The non-display region NDA is adjacent to the display region DA. The non-display region NDA may surround the display region DA. For example, a driving circuit, a driving line, or the like for driving the display region DA may be disposed in the non-display region NDA. For example, a panel pad region DPA may be disposed in the non-display region NDA.

The display panel DP may include a base substrate BS and a display layer DP-EL disposed on the base substrate BS. For example, when the display panel DP is implemented as an emission-type display panel, the display layer DP-EL may include a light emission element layer EL (in FIG. 9) and an encapsulation layer TFE (in FIG. 9). The encapsulation layer TFE (in FIG. 9) may cover the light emission element layer EL (in FIG. 9).

The base substrate BS may be a member which provides a base surface on which the display layer DP-EL is disposed. The base substrate BS may include a glass substrate, a metal substrate, a plastic substrate, and the like. However, embodiments are not limited thereto, and the base substrate BS may include an inorganic layer, an organic layer, or a composite material layer. The base substrate BS may be a flexible substrate which may be easily bent or folded.

For example, the base substrate BS may be a transparent glass substrate or a transparent polyimide substrate. In another embodiment, the base substrate BS may be an opaque polyimide substrate.

For example, a plurality of panel pads DPD may be disposed in the non-display region NDA of the display panel DP. The plurality of panel pads DPD may be arranged spaced apart from each other in the panel pad region DPA. In FIG. 3, FIG. 4, and the like, the plurality of panel pads DPD are illustrated as being arranged spaced apart at regular intervals while forming one column along the first axis direction DR1, but embodiments are not limited thereto. For example, the plurality of panel pads DPD may be aligned while forming a plurality of columns of 2 or more. In addition, the separation intervals between the plurality of panel pads DPD may be different from each other, or the plurality of panel pads DPD may be disposed aligned in a diagonal direction to have different slopes with respect to the second axis direction DR2.

The panel pads DPD may be connected to a display connection line DCL to be electrically connected to a circuit layer of the display panel DP. The circuit layer is disposed on the base substrate BS, and may include a switching transistor and a driving transistor for driving a plurality of emission elements included in the display layer DP-EL.

The display apparatus DD may include a panel driving unit DP-M. The panel driving unit DP-M may include a flexible circuit board FB-DP. The flexible circuit board FB-DP may be disposed on one side of the display panel DP. However, embodiments are not limited thereto.

The flexible circuit board FB-DP may include a plurality of connection pads CPD. The flexible circuit board FB-DP may include a base film BF and the plurality of connection pads CPD disposed on the base film BF. The base film BF may be made of a flexible material such as polyimide.

The flexible circuit board FB-DP may include a connection pad region CPA. The plurality of connection pads CPD may be disposed to respectively correspond to the plurality of panel pads DPD in the connection pad region CPA.

Referring FIG. 3, FIG. 4, and the like, the panel driving unit DP-M may include a driving chip IC. The driving chip IC may be mounted on the flexible circuit board FB-DP. The driving chip IC may be connected to signal lines CL of the flexible circuit board FB-DP to be electrically connected to the display panel DP. The driving chip IC may generate or process various electrical signals.

The flexible circuit board FB-DP may be electrically and physically coupled to the display panel DP through the bonding layer AP. The bonding layer AP may be disposed between the display panel DP and the flexible circuit board FB-DP. The bonding layer AP may be disposed between the panel pad region DPA and the connection pad region CPA.

Referring FIG. 3 and FIG. 4, the display apparatus DD according to an embodiment may include the flexible circuit board FB-DP and a panel driving board MB-DP. The flexible circuit board FB-DP may be disposed between the display panel DP and the panel driving board MB-DP to be electrically connected to the display panel DP and the panel driving board MB-DP.

The display apparatus DD according to an embodiment may include a driving bonding layer M-AP which electrically and physically couples the flexible circuit board FB-DP and the panel driving board MB-DP. The panel driving board MB-DP may include a driving pad region MPA. For example, a plurality of driving pads MPD may be disposed in the driving pad region MPA of the panel driving board MB-DP.

The bonding layer AP may include a conductive polymer. In an embodiment, the conductive polymer may include at least one among polythiophene (PT), poly(3,4-ethylenedioxythiophene) (PEDOT), polyaniline (PAM), polyacetylene (PA), polydiacetylene (PDA), poly(thiophenevinylene) (PTV), polyfluorene (PF), and polypyrrol (PPy).

In addition, in an embodiment, the conductive polymer may be a polymer such as polythiophene (PT), poly(3,4-ethylenedioxythiophene) (PEDOT), polyaniline (PAM), polyacetylene (PA), polydiacetylene (PDA), poly(thiophenevinylene) (PTV), polyfluorene (PF), or polypyrrol (PPy) doped with an acidic material.

For example, the acidic material to be doped may be poly(4-styrenesulfonate) (PSS), camphor sulfonic acid (CSA), toluene sulfonic acid (TSA), dodecyl benzene sulfonic acid (DBSA), Tosylate (ToS), and the like.

Specifically, the conductive polymer according to an embodiment may include at least one among PEDOT:PSS, PEDOT:CSA, PEDOT:TSA, PEDOT:DBSA, PANI(polyaniline):PSS, PANI:CSA, PANI:TSA, PANI:DBSA, PPy:PSS, PPy:CSA, PPy:TSA, PPy:DBSA, PT:PSS, PT:CSA, PT:TSA, PT:DBSA, and PEDOT:ToS.

In an embodiment, the conductive polymer may further include a photoreacting group. For example, the conductive polymer may further include an acrylate group and the like as the photoreacting group. In an embodiment, the conductive polymer may further include the photoreacting group to adjust the arrangement, molecular weight, degree of polymerization, and the like of the conductive polymer by ultraviolet light or infrared light.

Referring to FIG. 5, the bonding layer AP may include a conductive portion AP-C and a non-conductive portion AP-NC. The conductive portion AP-C may overlap the panel pad DPD and the connection pad CPD. The non-conductive portion AP-NC may not overlap the panel pad DPD and the connection pad CPD. The non-conductive portion AP-NC may be disposed between the conductive portions AP-C. The conductive portion AP-C and the non-conductive portion AP-NC may be alternately disposed, e.g., in the first axis direction DR1. The bonding layer AP may be provided by patterning the conductive portion AP-C disposed between the panel pads DPD and the connection pads CPD corresponding to the panel pads DPD and the non-conductive portion AP-NC disposed between the conductive portions AP-C.

The conductive portion AP-C is disposed between the panel pad DPD and the connection pad CPD, and may electrically connect the panel pad DPD and the connection pad CPD. The non-conductive portion AP-NC does not overlap the panel pad DPD and the connection pad CPD, and may fill between the base substrate BS of the display panel DP and the flexible circuit board FB-DP. The non-conductive portion AP-NC may fill between the base substrate BS and the base film BF.

A first conductivity value of the conductive portion AP-C and a second conductivity value of the non-conductive portion AP-NC may have the relationship of Equation 1 below.

$$\text{(First conductivity value)/(Second conductivity value)} \geq 10^2 \qquad \text{Equation 1}$$

For example, the conductivity of the conductive portion AP-C may be equal to or greater than about $10^2$ times of the conductivity of the non-conductive portion AP-NC. For example, the conductivity of the conductive portion AP-C and may be equal to or greater than about $10^6$ times to $10^7$ times of the conductivity of the non-conductive portion AP-NC. For example, in the descriptions, the conductivity means electric conductivity.

For example, both the conductive portion AP-C and the non-conductive portion AP-NC may include a conductive polymer. For example, the molecular weight of the conductive polymer included in the conductive portion AP-C and the molecular weight of the conductive polymer included in the non-conductive portion AP-NC may be different from each other. For example, the molecular weight of the conductive polymer included in the conductive portion AP-C may be larger than the molecular weight of the conductive polymer included in the non-conductive portion AP-NC. In addition, the conjugation length of the conductive polymer included in the conductive portion AP-C and the conjugation length of the conductive polymer included in the non-conductive portion AP-NC may be different from each other. For example, the molecular weight of the conductive polymer may be a weight average molecular weight.

In an embodiment, a conductive polymer forming the conductive portion AP-C and a conductive polymer forming the non-conductive portion AP-NC may have different three-dimensional structures, molecular arrangements, molecular weights, and the like, and thus, may have different electric conductivity values.

The bonding layer AP may include the conductive portion AP-C and the non-conductive portion AP-NC. For example, the conductive portion AP-C and the non-conductive portion AP-NC may be provided as one body. The thickness $t_{NC}$ of the non-conductive portion AP-NC may be greater than the thickness $t_C$ of the conductive portion AP-C. In the descriptions, the thickness refers to the thickness in the third axis direction DR3 on a plane defined by the first axis direction DR1 and the third axis direction DR3.

The driving bonding layer M-AP connecting the flexible circuit board FB-DP and the panel driving board MB-DP may include a conductive polymer as the above-described bonding layer AP, and may be patterned to have a conductive portion and a non-conductive portion. However, embodiments are not limited thereto. The driving bonding layer M-AP may be an anisotropic conductive film (ACF) including a conductive ball and the like.

In the display apparatus DD according to an embodiment illustrated in FIG. 3 and FIG. 4, the flexible circuit board FB-DP may be a connection circuit board which connects the display panel DP and the panel driving board MB-DP. In this case, the panel driving board MB-DP may provide a driving signal to the display panel DP.

Referring to FIG. 6, an auxiliary bonding layer S-AP may be further disposed at an edge ED-AP of the bonding layer AP. The auxiliary bonding layer S-AP may be disposed adjacent to the edge ED-AP of the bonding layer AP at which the bonding layer AP is exposed to the outside such that the edge ED-AP of the bonding layer AP is covered by the auxiliary bonding layer S-AP.

The auxiliary bonding layer S-AP may increase the coupling force between the display panel DP and the flexible circuit board FB-DP. The auxiliary bonding layer S-AP may include a polymer resin. The polymer resin may include at least one among an acrylic resin, an epoxy-based resin, and a urethane-based resin. For example, the polymer resin may be an acrylic polymer resin.

FIG. 7A to FIG. 9 are views showing a portion of a display apparatus according to an embodiment. Hereinafter, in the description with reference to FIG. 7A to FIG. 9, the same contents as those described above with reference to the display apparatus of FIG. 1 to FIG. 6 will not be repeated for descriptive convenience. Instead, the description will mainly focus on differences.

Figure 7A:
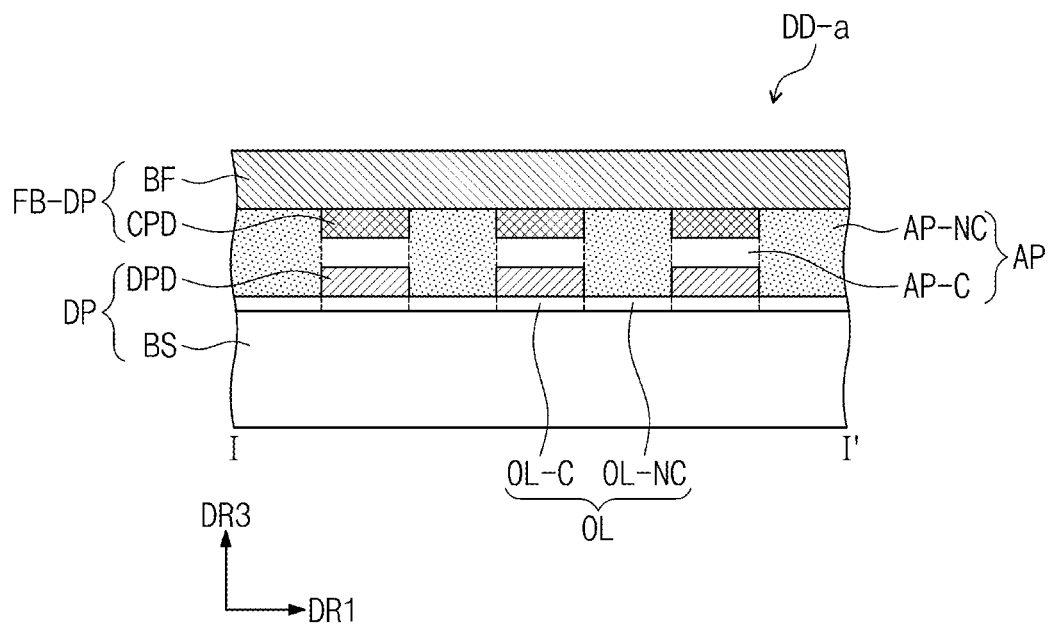
FIG. 7A is a cross-sectional view taken along lines I-I' of FIG. 3 showing a portion of a display apparatus according to another embodiment.
Figure 7B:
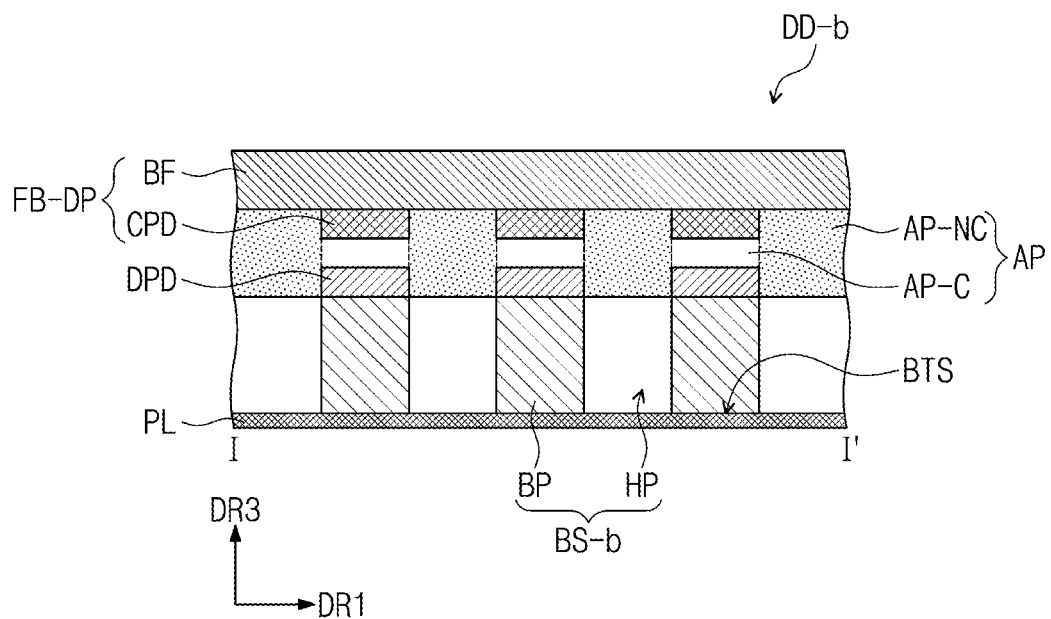
FIG. 7B is a cross-sectional view taken along line II-IF of FIG. 3 showing a portion of a display apparatus according to an embodiment.

FIG. 7A and FIG. 7B are each a cross-sectional view showing a portion of a display apparatus according to an embodiment. FIG. 7A and FIG. 7B each show another embodiment of a portion corresponding to line I-I' of FIG. 3.

Referring to FIG. 7A, a display apparatus DD-a according to an embodiment may further include an organic layer OL disposed between the base substrate BS and the panel pads DPD of a display panel. The organic layer OL may be a polymer layer including a photoreacting group. The organic layer OL may be an acrylate polymer layer including an acrylate group as the photoreacting group.

The organic layer OL may include a first portion OL-C overlapping the panel pad DPD and a second portion OL-NC not overlapping the panel pad DPD. In the organic layer OL, the reactivity of the photoreacting group in the first portion OL-C and the reactivity of the photoreacting group in the second portion OL-NC may be different from each other.

The organic layer OL may increase the coupling force between the bonding layer AP and the base substrate BS. In addition, the arrangement of a conductive polymer of the non-conductive portion AP-NC disposed on the second portion OL-AP may be different from the arrangement of a conductive polymer of the conductive portion AP-C. Due to the mutual attraction (for example, van der Waals force) between the organic layer OL and the conductive polymer, the physical properties of the conductive polymer in each of the conductive portion AP-C and the non-conductive portion AP-NC may be different from each other.

Referring to FIG. 7B, in a display apparatus DD-b according to an embodiment, a base substrate BS-b of a display panel may include a light transmitting portion HP and a non-light transmitting portion BP. In the display apparatus DD-b according to an embodiment, the base substrate BS-b may be made of opaque polyimide.

The non-light transmitting portion BP of the base substrate BS-b may be a portion overlapping the panel pad DPD. In addition, the light transmitting portion HP of the base substrate BS-b may be a portion overlapping the non-conductive portion AP-NC of the bonding layer AP.

In the base substrate BS-b, the light transmitting portions HP may be openings defined between the non-light transmitting portions BP. The light transmitting portions HP may be openings defined by opening a bottom surface BTS of the base substrate BS-b.

For example, a protection layer PL may be disposed on the side of the bottom surface BTS of the base substrate BS-b. The protection layer PL may be disposed on the bottom surface BTS of the base substrate BS-b to serve as a support member which supports the base substrate BS-b. The protection layer PL may be an organic layer. The protection layer PL may be implemented as a film. The protection layer PL may include a polymer film.

In the display apparatuses DD-a and DD-b of the embodiments illustrated in FIG. 7A and FIG. 7B, the bonding layer AP may include the conductive portion AP-C and the non-conductive portion AP-NC. The bonding layer AP is formed by including a conductive polymer. For example, the conductivity values of the conductive polymers in the conductive portion AP-C and the non-conductive portion AP-NC may be different from each other. The conductivity value of the conductive portion AP-C may be at least about $10^2$ times greater than the conductivity value of the non-conductive portion AP-NC.

Figure 8:
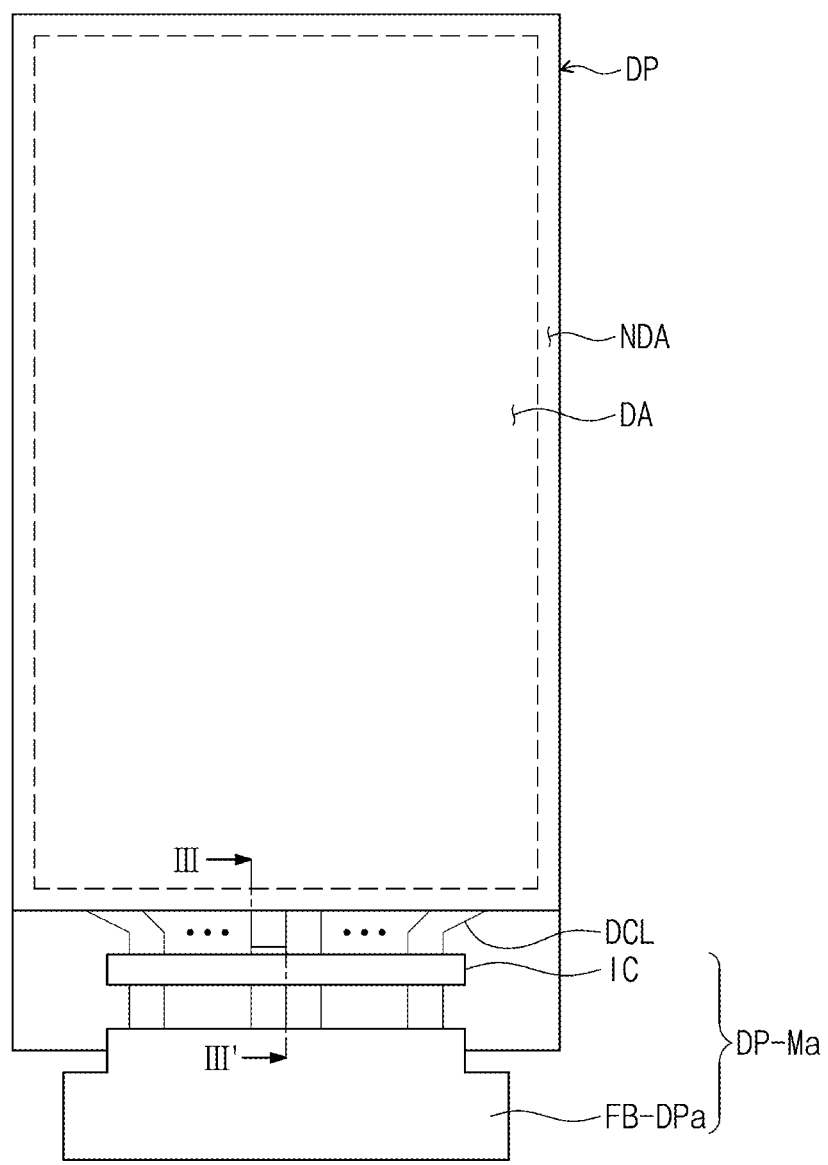
FIG. 8 is a plan view showing a portion of a display apparatus according to an embodiment.
Figure 9:
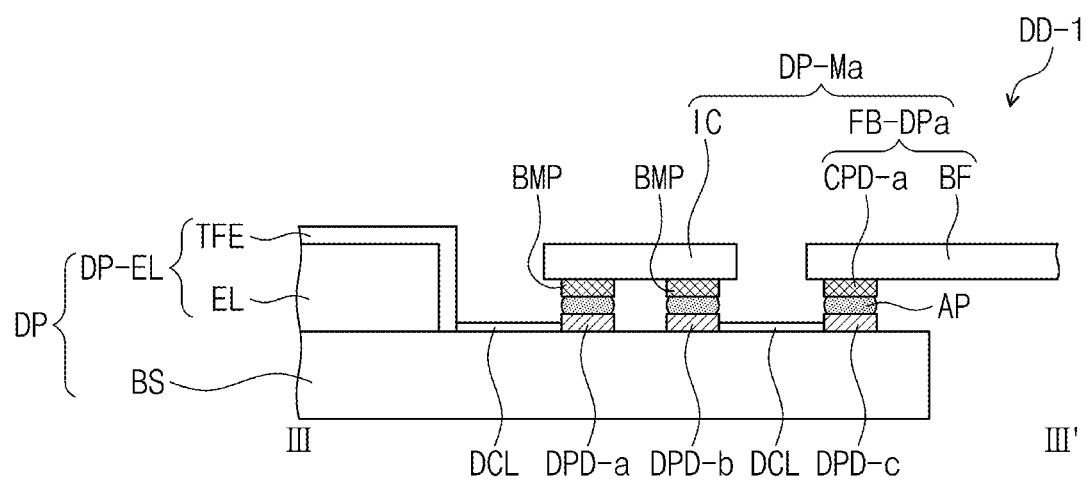
FIG. 9 is a cross-sectional view taken along line of FIG. 8 showing a portion of a display apparatus according to an embodiment.

FIG. 8 is a plan view showing a portion of a display apparatus according to an embodiment. FIG. 9 is a cross-sectional view showing a portion of a display apparatus according to an embodiment. FIG. 9 is a cross-sectional view showing a portion corresponding to line III-III' of FIG. 8.

A display apparatus DD-1 may include the display panel DP and a flexible circuit board FB-DPa. In addition, the display apparatus DD-1 may include the driving chip IC disposed in the non-display region NDA of the display panel DP. The flexible circuit board FB-DPa may be disposed on one side of the display panel DP. The driving chip IC may be disposed adjacent to the display layer DP-EL. For example, the driving chip IC may be disposed between the display layer DP-EL and the flexible circuit board FB-DPa.

The display panel DP may include the base substrate BS and the display layer DP-EL. The display layer DP-EL may include the light emission element layer EL and the encapsulation layer TFE which covers the light emission element layer EL.

Panel pads DPD-a, DPD-b, and DPD-c may be disposed in the non-display region NDA. A first panel pad DPD-a and a second panel pad DPD-b may be electrically connected to a bump BMP of the driving chip IC. A third panel pad DPD-c may be electrically connected to a connection pad CPD-a of the flexible circuit board FB-DPa.

The above-described bonding layer AP according to an embodiment may be disposed at least one among between the third panel pad DPD-c and the connection pad CPD-a of the flexible circuit board FB-DPa, between the first panel pad DPD-a and the bump BMP of the driving chip IC, and between the second panel pad DPD-b and the bump BMP of the driving chip IC, e.g., in a vertical direction. In a portion in which the above-described bonding layer AP is not provided, an anisotropic conductive film may be disposed.

The same contents as those described with reference to FIG. 5 and the like may be applied to the bonding layer AP. The bonding layer AP may include the conductive portion AP-C (in FIG. 5) and the non-conductive portion AP-NC (in FIG. 5). The bonding layer AP is formed by including a conductive polymer, and the conductivity value of the conductive portion AP-C (in FIG. 5) may be greater than the conductivity value of the non-conductive portion AP-NC (in FIG. 5). For example, the ratio of the conductivity value of the conductive portion AP-C(in FIG. 5) and the conductivity value of the non-conductive portion AP-NC (in FIG. 5) may be about $10^2$ or greater.

In the display apparatus DD-1 according to an embodiment illustrated in FIG. 8 and FIG. 9, the flexible circuit board FB-DPa may be a main circuit board. The flexible circuit board FB-DPa, which is the main circuit board, may include various driving circuits for driving the display panel DP, connectors for supplying power, and the like.

Referring to FIG. 8, the driving chip IC may be mounted on the base substrate BS of the display panel DP, unlike the driving chip IC illustrated in FIG. 3. The driving chip IC may generate or process various electrical signals.

For example, a display connection line DCL may be disposed on the base substrate BS of the display panel DP. The display connection line DCL may connect between the circuit layer of the display panel DP and the first panel pad DPD-a and between the second panel pad DPD-b and the third panel pad DPD-c.

Figure 10:
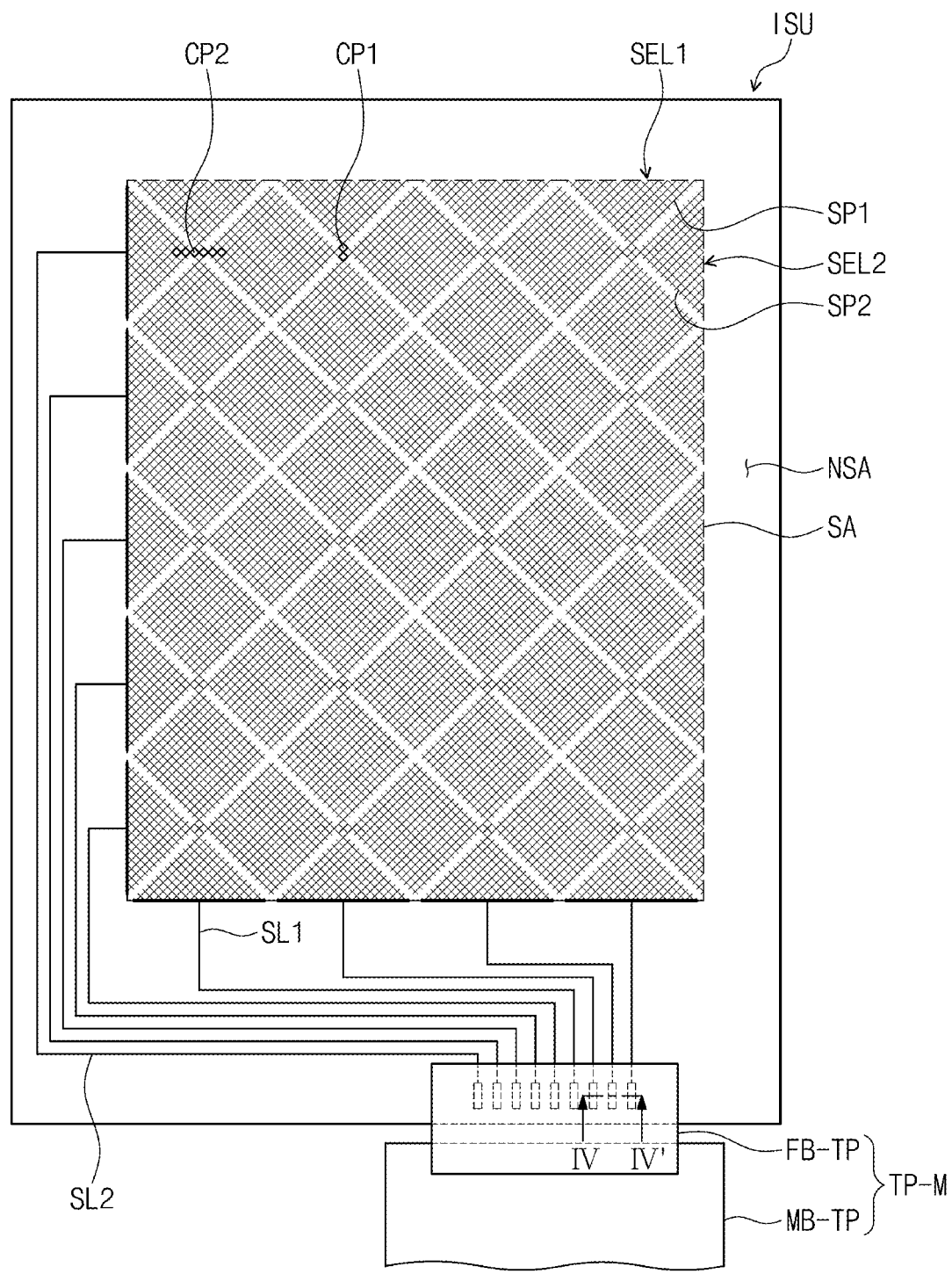
FIG. 10 is a plan view showing a portion of a display apparatus according to an embodiment.
Figure 11:
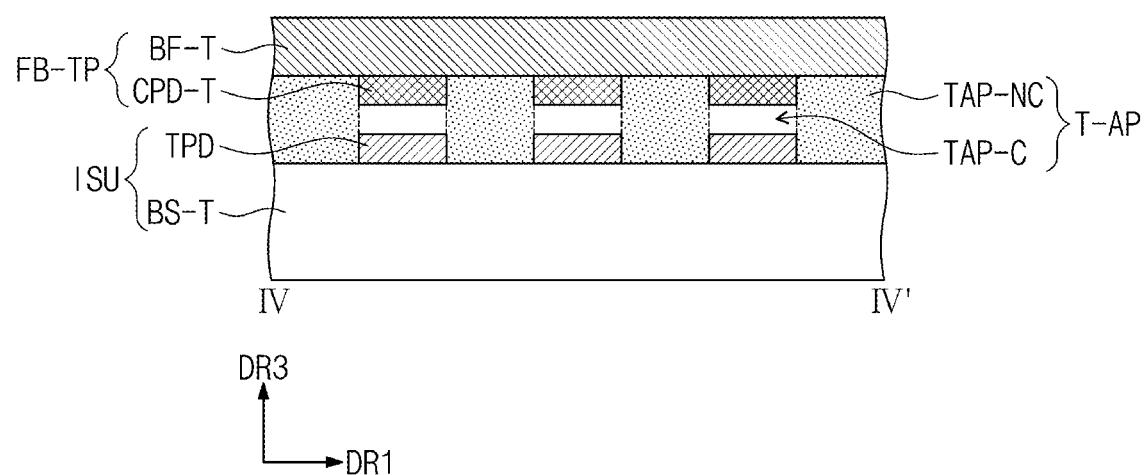
FIG. 11 is a cross-sectional view showing a portion of a display apparatus according to an embodiment.

FIG. 10 is a plan view showing a portion of a display apparatus according to an embodiment. FIG. 10 may include the input sensing unit ISU and the sensing driving unit TP-M included in the display apparatus DD (in FIG. 2) according to an embodiment. FIG. 11 is a cross-sectional view of a portion corresponding to line IV-IV' of FIG. 10.

Referring FIG. 2 and FIG. 10, in the display apparatus DD according to an embodiment, the input sensing unit ISU may be provided as a separate member on the display panel DP. However, unlike what is illustrated, the input sensing unit ISU may be directly disposed on the display panel DP. For example, the input sensing unit ISU may be directly disposed on the encapsulation layer TFE of the display panel DP.

The input sensing unit ISU may sense an external input TC (in FIG. 1) to obtain information on the position or intensity of the external input. For example, the external input may include various types of external inputs, such as a part of a user's body, light, heat, or pressure. Also, the input sensing unit ISU may sense an input contacting the input sensing unit ISU as well as an input in close proximity therewith or adjacent thereto.

The input sensing unit ISU may include a sensing region SA and a non-sensing region NSA. The sensing region SA may overlap the display region DA. The non-sensing region NSA is adjacent to the sensing region SA. The non-sensing region NSA may surround the edge of the sensing region SA. However, embodiments are not limited thereto. For example, the non-sensing region NSA may be adjacent to only a portion of the edge of the sensing region SA, or is may be omitted.

The input sensing unit ISU may include a plurality of sensing electrodes SEL1 and SEL2, a plurality of sensing lines SL1 and SL2, and a plurality of sensing pads TPD. The sensing electrodes SEL1 and SEL2 may be disposed in the sensing region SA, and the sensing pads TPD may be disposed in the non-sensing region NSA. A sensing pad region TPA in which the sensing pads TPD are disposed may be disposed adjacent to one end of the input sensing unit ISU.

The sensing lines SL1 and SL2 are connected to the sensing electrodes SEL1 and SEL2, and may be extended in the non-sensing region NSA to be connected to the sensing pads TPD. The sensing pads TPD may be connected to a sensing driving board MB-TP for driving the input sensing unit ISU through a sensing flexible circuit board FB-TP.

The sensing electrodes SEL1 and SEL2 and the sensing lines SL1 and SL2 may have a single-layered structure or a multi-layered structure laminated in an upward direction. The sensing electrodes SEL1 and SEL2 and the sensing lines SL1 and SL2 may be provided on a sensing base substrate BS-T. The sensing base substrate BS-T may include a glass substrate, a metal substrate, a plastic substrate, or the like. However, embodiments are not limited thereto. For example, the sensing base substrate BS-T may be an inorganic layer, an organic layer, or a composite material layer.

For example, when the input sensing unit ISU is directly disposed on the display panel DP, the sensing base substrate BS-T may be omitted. In this case, the sensing electrodes SEL1 and SEL2 and the sensing lines SL1 and SL2 may be directly provided on the display panel DP.

The sensing electrodes SEL1 and SEL2 may include a plurality of first sensing is electrodes SEL1 and a plurality of second sensing electrodes SEL2. The sensing lines SL1 and SL2 may include a plurality of first signal lines SL1 connected to the first sensing electrodes SEL1 and a plurality of second signal lines SL2 connected to the second sensing electrodes SEL2.

The first sensing electrodes SEL1 may be extended so as to cross the second sensing electrodes SEL2 while being insulated therefrom. The first sensing electrode SEL1 and the second sensing electrode SEL2 may have a mesh shape. Capacitance may be formed between the first sensing electrodes SEL1 and the second sensing electrode SEL2.

Each of the first sensing electrodes SEL1 may include a plurality of first sensor units SP1 arranged in the first axis direction DR1 and a plurality of first connectors CP1 for connecting the first sensor units SP1. The first sensor units SP1 may have a mesh shape. Each of the first connectors CP1 may be disposed between two first sensor units SP1 adjacent to each other to electrically connect the two first sensor units SP1.

Each of the second sensing electrodes SEL2 may include a plurality of second sensor units SP2 arranged in the second axis direction DR2 and a plurality of second connectors CP2 for connecting the second sensor units SP2. The second sensor units SP2 may have a mesh shape. Each of the second connectors CP2 may be disposed between two second sensor units SP2 adjacent to each other to electrically connect the two second sensor units SP2.

The first sensor units SP1 and the second sensor units SP2 may be spaced apart from each other while not overlapping each other, and thus, may be disposed alternately with each other. The second connectors CP2 may be extended so as to cross the first connectors CP1 while being insulated therefrom.

For example, the sensing driving unit TP-M may be disposed on one side of the input sensing unit ISU. The sensing driving unit TP-M may include the sensing flexible circuit board FB-TP and the sensing driving board MB-TP. In addition, a sensing bonding layer T-AP may be disposed between the input sensing unit ISU and the sensing flexible circuit board FB-TP. The sensing flexible circuit board FB-TP may be disposed on one side of the input sensing unit ISU and include sensing connection pads CPD-T corresponding to the plurality of sensing pads TPD. The sensing flexible circuit board FB-TP may include a base film BF-T and a plurality of the sensing connection pads CPD-T provided on one surface of the base film BF-T.

The sensing bonding layer T-AP may be disposed between the sensing pad region TPA of the input sensing unit ISU and the sensing flexible circuit board FB-TP. The same contents as those described above with reference to the bonding layer AP may be applied to the sensing bonding layer T-AP. The sensing bonding layer T-AP may include a conductive polymer. The conductivity value of a sensing conductive portion TAP-C may be at least about $10^2$ times of the conductivity value of a sensing non-conductive portion TAP-NC.

The sensing bonding layer T-AP may include a plurality of the sensing conductive portions TAP-C and a plurality of the sensing non-conductive portion TAP-NC. The sensing conductive portions TAP-C may be a portion overlapping the sensing pads TPD and the sensing connection pads CPD-T, and the sensing non-conductive portions TAP-NC may be a portion not overlapping the sensing pads TPD and the sensing connection pads CPD-T.

The sensing conductive portion TAP-C and the sensing non-conductive portion TAP-NC may be alternately disposed with each other. The sensing non-conductive portion TAP-AC may be disposed between the sensing conductive portions TAP-C. The sensing bonding layer T-AP may be patterned to include the sensing conductive portion TAP-C and the sensing non-conductive portion TAP-NC.

A display apparatus according to an embodiment electrically connects a display panel and a circuit board and the like using a bonding layer patterned to have a conductive portion and a non-conductive portion, and thus, may have excellent reliability. In addition, the display apparatus according to an embodiment includes a bonding layer having a conductive portion overlapping panel pads and a non-conductive portion not overlapping the panel pads, and thus, may have excellent electrical reliability even when the display apparatus is implemented to have high resolution.

Hereinafter, referring to FIG. 12A to FIG. 15F and the like, a method of manufacturing a display apparatus according to an embodiment will be described. In the following description of the method of manufacturing a display apparatus according to an embodiment, the same contents as those described above with reference to the display apparatus according to an embodiment will not be repeated for descriptive convenience. Instead, the description will mainly focus on differences.

Figure 12A:
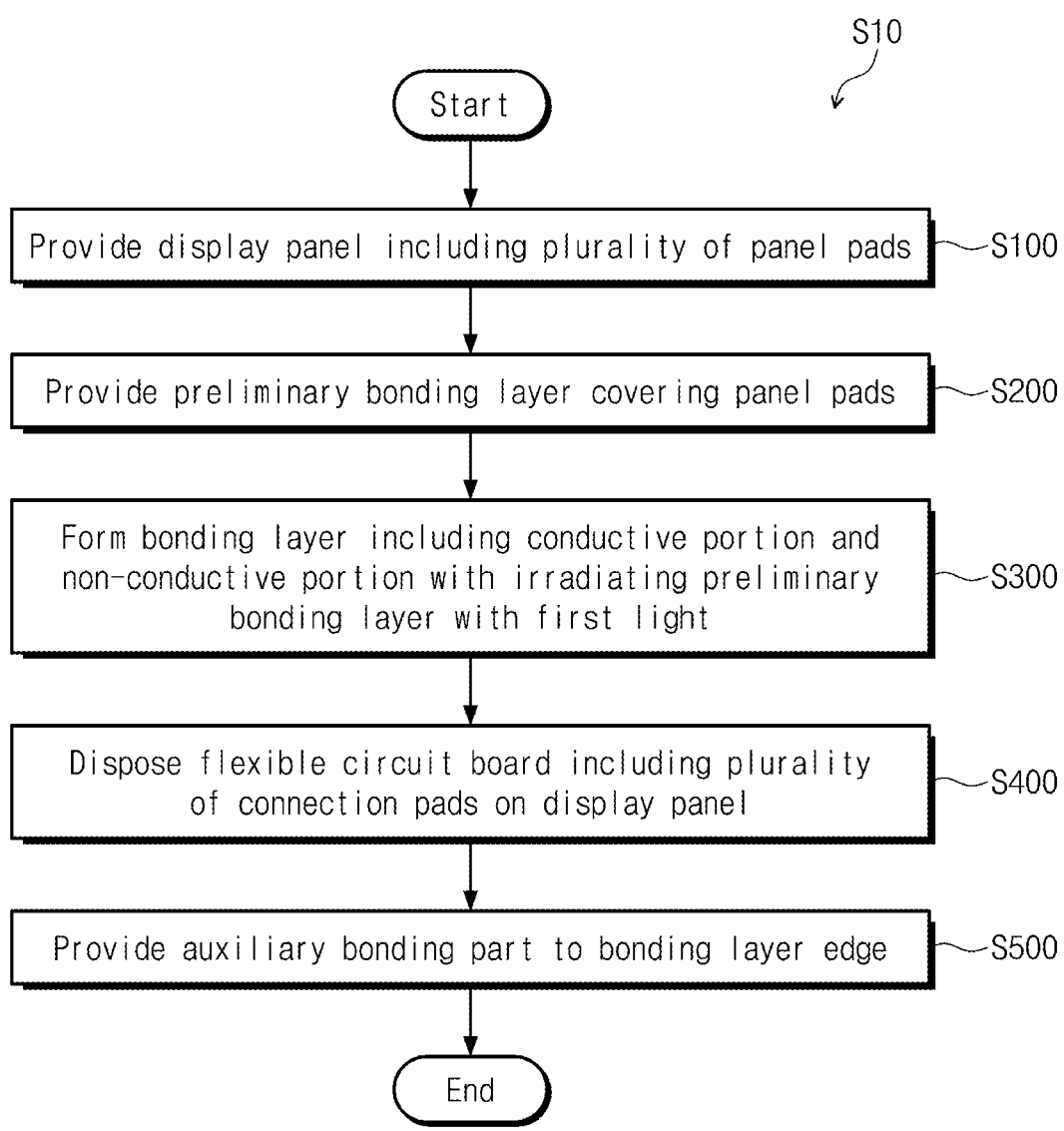
FIG. 12A and FIG. 12B are each a flowchart showing a method of manufacturing a display apparatus according to an embodiment.
Figure 12B:
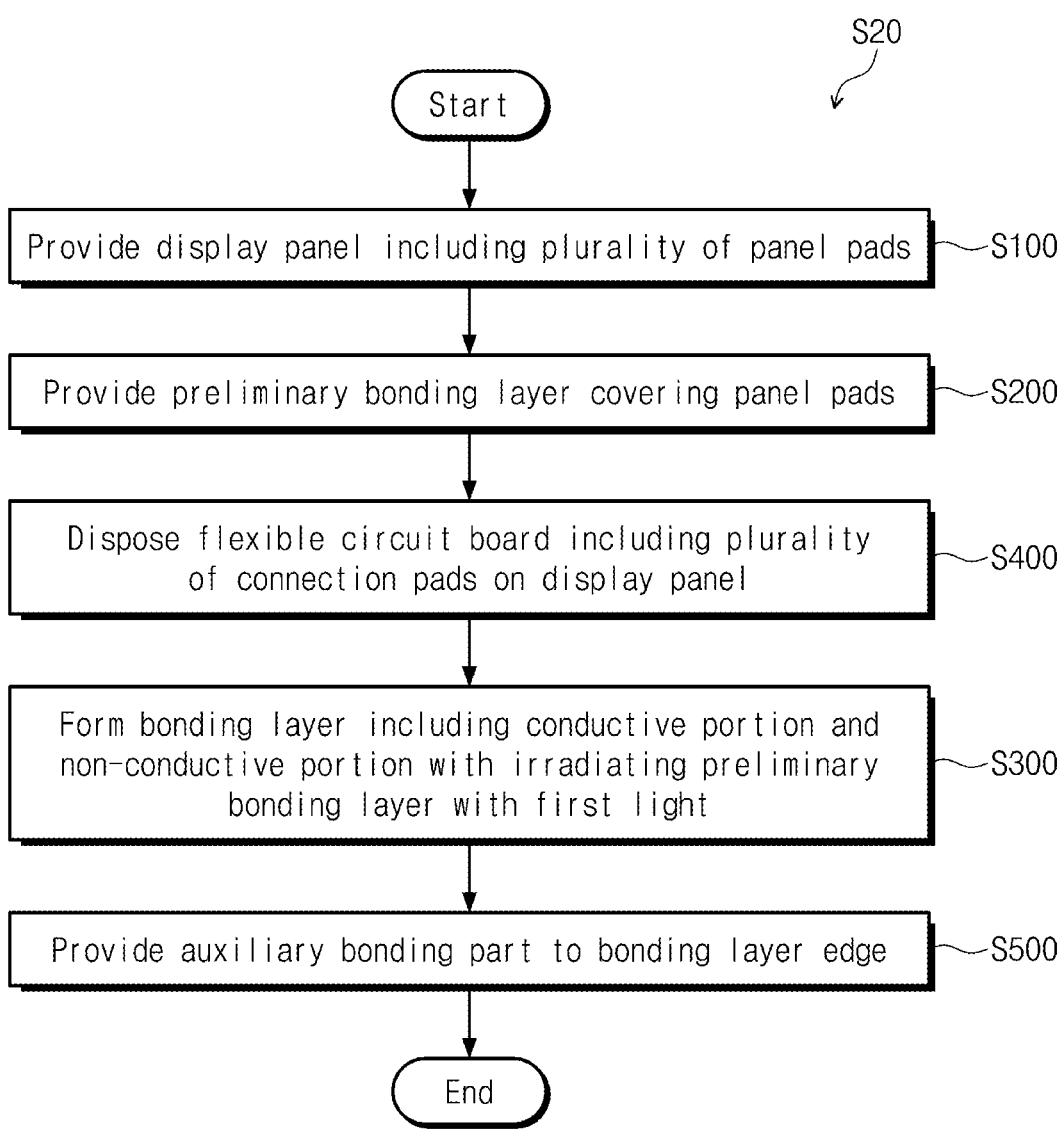

FIG. 12A and FIG. 12B are each a flowchart showing a method of manufacturing a display apparatus according to an embodiment. FIG. 13A to FIG. 13F are views schematically showing steps corresponding to the steps of the method of manufacturing a display apparatus according to an embodiment illustrated in FIG. 12A. FIG. 14A and FIG. 14B are views schematically showing some steps of the method of manufacturing a display apparatus according to an embodiment illustrated in FIG. 12B. FIG. 15A to FIG. 15F are views schematically showing steps of a method of manufacturing a display apparatus according to an embodiment. In FIG. 13A to FIG. 13F, FIG. 14A, FIG. 14B, and FIG. 15A to FIG. 15F, only a portion of the display panel DP is illustrated for convenience of description.

A manufacturing method S10 of a display apparatus according to an embodiment is may include a step S100 providing a display panel including a plurality of panel pads, a step S200 providing a preliminary bonding layer covering the panel pads, a step S300 forming a bonding layer including a conductive portion and a non-conductive portion with irradiating the preliminary bonding layer with a first light, and a step S400 disposing a flexible circuit board including a plurality of connection pads on the display panel.

Figure 13A:
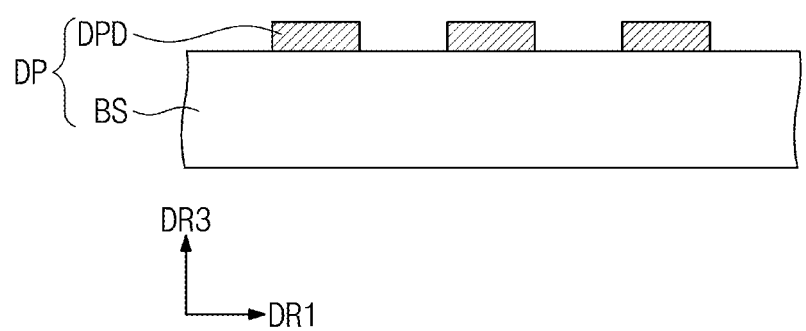
FIG. 13A, 13B, 13C, 13D, 13E, and FIG. 13F are views schematically showing each step of a method of manufacturing a display apparatus according to an embodiment.
Figure 14A:
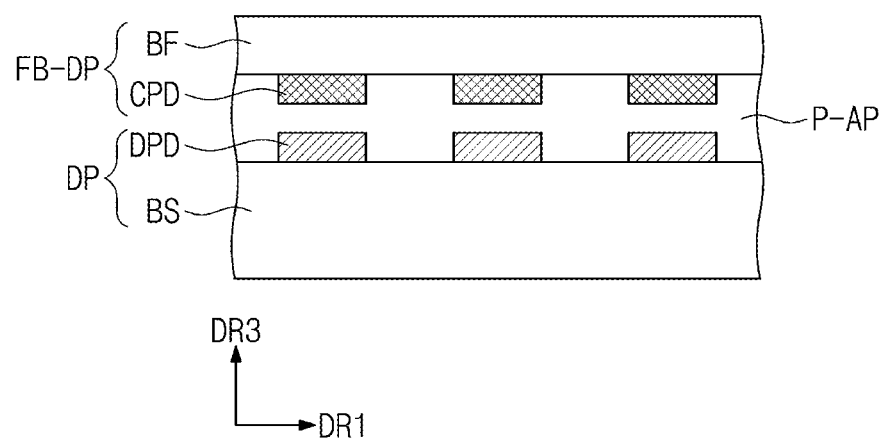
FIG. 14A and FIG. 14B are views schematically showing one step of a method of manufacturing a display apparatus according to an embodiment.
Figure 14B:
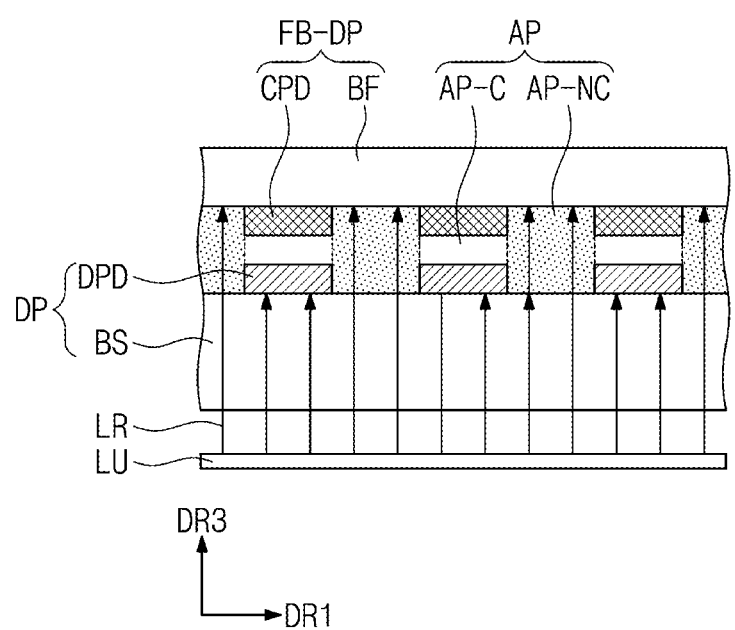

FIG. 13A shows the step S100 of providing a display panel including a plurality of panel pads. In the display panel DP, a plurality of panel pads DPD may be disposed on one surface of the base substrate BS. For example, the display panel DP may include the base substrate BS and the panel pads DPD disposed on the base substrate BS.

Figure 13B:
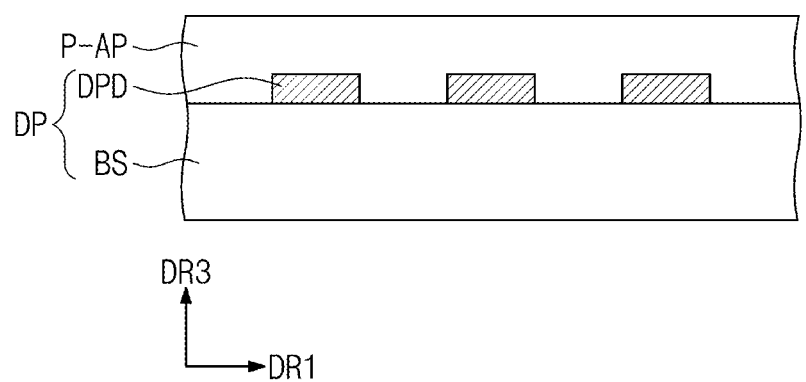

FIG. 13B illustrates the step S200 of providing a preliminary bonding layer covering the panel pads. A preliminary bonding layer P-AP is provided on the display panel DP, and may be provided to cover the panel pads DPD. The preliminary bonding layer P-AP may be provided as a liquid or film type.

The preliminary bonding layer P-AP may include a conductive polymer. The preliminary bonding layer P-AP may include at least one among polythiophene (PT), poly(3,4-ethylenedioxythiophene) (PEDOT), polyaniline (PAM), polyacetylene (PA), polydiacetylene (PDA), poly(thiophenevinylene) (PTV), polyfluorene (PF), and polypyrrol (PPy).

In addition, in an embodiment, the preliminary bonding layer P-AP may include at least one among PEDOT:PSS, PEDOT:CSA, PEDOT:TSA, PEDOT:DBSA, PAM (polyaniline):PSS, PANI:CSA, PANI:TSA, PANI:DBSA, PPy:PSS, PPy:CSA, PPy:TSA, PPy:DBSA, PT:PSS, PT:CSA, PT:TSA, PT:DBSA, and PEDOT:ToS.

The degree of polymerization of the conductive polymer included in the preliminary bonding layer P-AP may be smaller than the degree of polymerization of a conductive polymer included in the bonding layer AP (in FIG. 13D) to be described later. For example, the preliminary bonding layer P-AP may include a monomer or oligomer which is a repeating unit of the conductive polymer. When the preliminary bonding layer P-AP includes a monomer or oligomer of the conductive polymer, after the preliminary bonding layer P-AP is provided, a step of polymerizing the monomer or oligomer may be further performed. The polymerization step may be performed by providing high-temperature heat or providing ultraviolet light to the preliminary bonding layer P-AP.

Figure 13C:
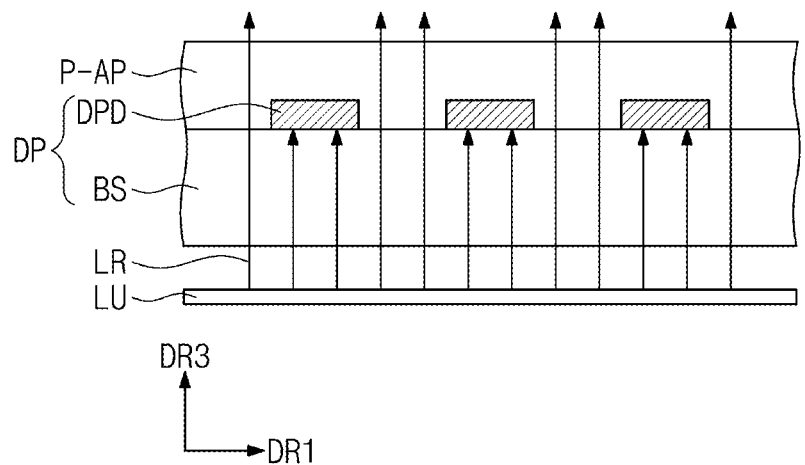
Figure 13D:
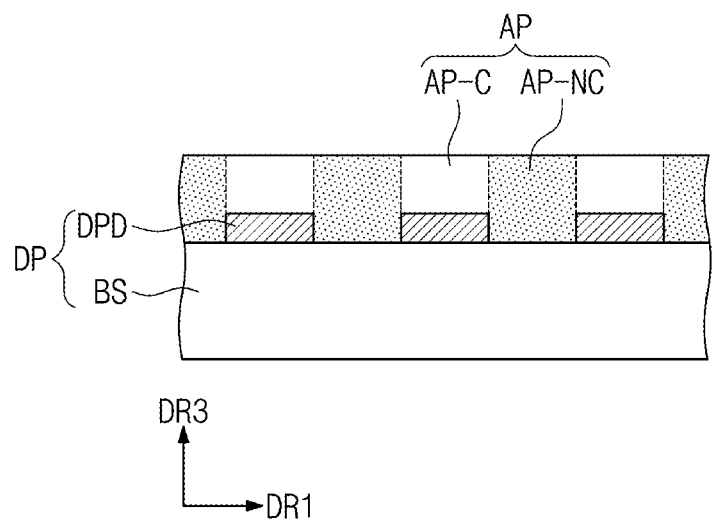

FIG. 13C and FIG. 13D show the step S300 of forming a bonding layer including a conductive portion and a non-conductive portion with irradiating the preliminary bonding layer with a first light. FIG. 13C illustrates a step of providing a first light LR to the preliminary bonding layer P-AP. FIG. 13D illustrates a step of forming the bonding layer AP including the conductive portion AP-C and the non-conductive portion AP-NC.

The first light LR emitted from a light source LU may pass through the base substrate BS and be provided to the preliminary bonding layer P-AP. The first light LR emitted from the light source LU is light having high straightness, and may be incident on the preliminary bonding layer. For example, the panel pads DPD may serve as a mask. For example, the first light may pass through the base substrate BS using the panel pads DPD as a mask and be provided to the preliminary bonding layer P-AP. Light passing through the base substrate BS may be blocked in a portion in which the panel pads DPD are disposed. The first light LR may be irradiated on the preliminary bonding layer P-AP in a portion in which the panel pads DPD are not disposed, and the first light LR may not be provided in a portion of the preliminary bonding layer P-AP overlapping the panel pads DPD.

Accordingly, due to the difference in the amount of irradiation of the first light LR, the bonding layer AP may include the conductive portion AP-C overlapping the panel pads DPD and the non-conductive portion AP-NC not overlapping the panel pads DPD. The non-conductive portion AP-NC formed by irradiating the preliminary bonding layer P-AP with the first light LR may have a significantly lower conductivity value than the conductive portion AP-C not irradiated with the first light LR. For example, the conductivity value of the conductive portion AP-C may be equal to or greater than at least about $10^2$ times of the conductivity value of the non-conductive portion AP-NC.

The first light LR may include an ultraviolet light UV or an infrared light IR. For example, the first light LR may be ultraviolet light. Specifically, the first light LR may have a center wavelength of about 250 nm to about 450 nm.

Figure 13E:
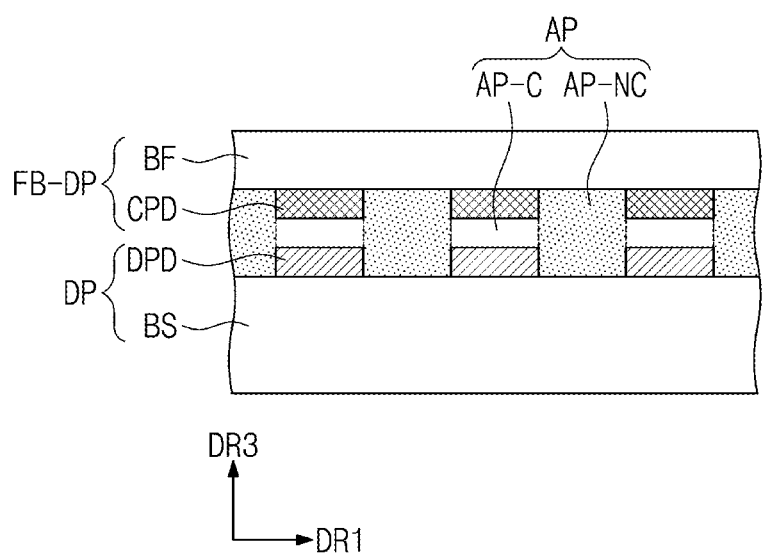

FIG. 13E shows the step S400 of disposing a flexible circuit board including a plurality of connection pads on the display panel. The connection pads CPD of the flexible circuit board FB-DP may respectively correspond to the panel pads DPD of the display panel DP. The connection pads CPD may be disposed to respectively correspond to the conductive portions AP-C of the bonding layer AP.

For example, the conductive portion AP-C of the bonding layer AP may overlap the panel pad DPD and the connection pad CPD, and the non-conductive portion AP-NC of the bonding layer AP may not overlap the panel pad DPD and the connection pad CPD.

For example, when the flexible circuit board FB-DP is disposed on the display panel DP, pressure may be provided on the flexible circuit board FB-DP. By the provided pressure, the coupling force between the connection pads CPD of the flexible circuit board FB-DP and the conductive portions AP-C may increase. In addition, when the flexible circuit board FB-DP is disposed on the display panel DP, heat and pressure may be provided together on the flexible circuit board FB-DP. Under the high temperature condition, the bonding area between the connection pads CPD of the flexible circuit board FB-DP and the conductive portions AP-C may be increased, and thus, may increase electrical properties and coupling force.

Figure 13F:
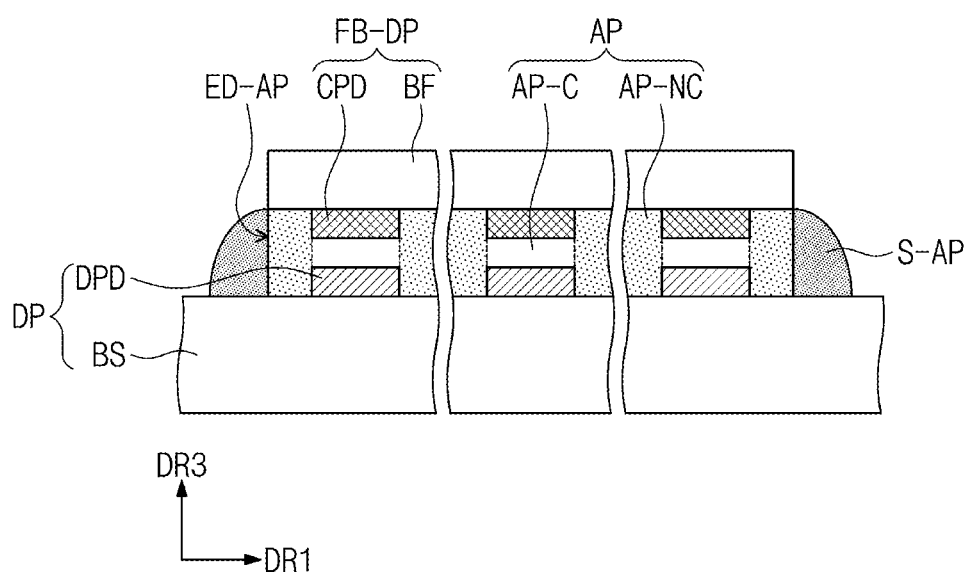

For example, the manufacturing methods S10 and S20 of a display apparatus according to an embodiment may further include a step S500 of providing an auxiliary bonding layer at an edge of the bonding layer. FIG. 13F illustrates the step S500 of providing an auxiliary bonding layer to an edge of the bonding layer.

Referring to FIG. 13F, the auxiliary bonding layer S-AP may be disposed at the edge ED-AP of the bonding layer AP to cover the bonding layer AP. The auxiliary bonding layer S-AP may be provided in the form of a liquid or solid. The auxiliary bonding layer S-AP may be provided as a liquid polymer resin and may be formed by curing the polymer resin. The polymer resin may be cured by heat, ultraviolet rays, or the like.

The method of manufacturing a display apparatus according to an embodiment may pattern the conductive portion AP-C and the non-conductive portion AP-NC using the panel pads DPD as a mask. Thus, a display apparatus manufactured by the manufacturing method of a display apparatus according to an embodiment may have excellent reliability in terms of electrical connection properties even when a pitch (e.g., an interval) between the panel pads DPD is small. For example, since the conductive portion AP-C and the non-conductive portion AP-NC are patterned with the arrangement interval of the panel pads DPD, an electric connection is mainly made in a portion overlapping the panel pads DPD, so that problems such as a short circuit and an open circuit may be solved compared to a case in which an anisotropic conductive film including a typical conductive ball is used.

When compared to the manufacturing method S10 of a display apparatus according to an embodiment illustrated in FIG. 12A, there is a difference in the manufacturing method S20 of a display apparatus according to an embodiment illustrated in FIG. 12B in that the order of the step S300 of forming a bonding layer including a conductive portion and a non-conductive portion with irradiating the preliminary bonding layer with a first light and the step S400 of disposing a flexible circuit board including a plurality of connection pads on the display panel is changed.

For example, the manufacturing method S20 of a display apparatus according to an embodiment may perform the step S400 of disposing a flexible circuit board including a plurality of connection pads on the display panel, and then perform the step S300 of forming a bonding layer including a conductive portion and a non-conductive portion with irradiating the preliminary bonding layer with a first light.

FIG. 14A and FIG. 14B are views showing some steps of the manufacturing method S20 of a display apparatus according to an embodiment illustrated in FIG. 12B. FIG. 14A shows the step S400 of disposing a flexible circuit board including a plurality of connection pads on the display panel.

Referring to FIG. 14A, the flexible circuit board FB-DP may be disposed on the preliminary bonding layer P-AP. For example, compared to what is illustrated in FIG. 13E, FIG. 14A illustrates that the flexible circuit board FB-DP is provided on the preliminary bonding layer P-AP before the first light LR is irradiated.

FIG. 14B shows the step S300 of forming a bonding layer including a conductive portion and a non-conductive portion with irradiating the preliminary bonding layer with a first light. For example, after the preliminary bonding layer P-AP, which is not patterned, is disposed between the display panel DP and the flexible circuit board FB-DP as illustrated in FIG. 14A, the first light LR, which passes through the base substrate BS of the display panel DP, may be provided to the preliminary bonding layer P-AP to form the bonding layer AP.

Before the step S400 of disposing a flexible circuit board including a plurality of connection pads on the display panel, which is illustrated in FIG. 14A, the step S100 of providing a display panel including a plurality of panel pads, and the step S200 of providing a preliminary bonding layer covering the panel pads, which are illustrated in FIG. 13A and FIG. 13B, may be performed. After the step S300 of forming a bonding layer including a conductive portion and a non-conductive portion with irradiating the preliminary bonding layer with a first light, which is illustrated in FIG. 14B, the step S500 of providing an auxiliary bonding layer to an edge of the bonding layer, which is illustrated in FIG. 13F, may be performed.

The manufacturing method of a display apparatus according to an embodiment described with reference to FIG. 12B, FIG. 14A and FIG. 14B may provide a display apparatus having high reliability properties even when the display apparatus is implemented to have a high resolution, which is similar to the manufacturing method of a display apparatus according to an embodiment described with reference to FIG. 12A and FIG. 13A to FIG. 13F.

FIG. 15A to FIG. 15F are views schematically showing a method of manufacturing a display apparatus according to an embodiment. When compared to the manufacturing method of a display apparatus according to an embodiment illustrated in FIG. 13A to FIG. 13F, there is a difference in the manufacturing method of a display apparatus according to an embodiment illustrated in FIG. 15A to FIG. 15F in the configuration of the base substrate BS-b of the display panel DP. FIG. 15A to FIG. 15F may show a method of manufacturing the display apparatus DD-b corresponding to FIG. 7B described above. In the description of the manufacturing method of a display apparatus according to an embodiment illustrated in FIG. 15A to FIG. 15F, the same contents as those described above with reference to the manufacturing method of a display apparatus according to an embodiment illustrated in FIG. 13A to FIG. 13F will not be repeated for descriptive convenience. Instead, the description will mainly focus on differences.

The base substrate BS-b may include the light transmitting portion HP and the non-light transmitting portion BP. The light transmitting portion HP may be a portion defined as an opening between the non-light transmitting portions BP. The light transmitting portion HP may be an opening provided by opening the bottom surface BTS of the base substrate BS-b. The base substrate BS-b may be an opaque polyimide substrate except for the light transmitting portion HP.

Figure 15A:
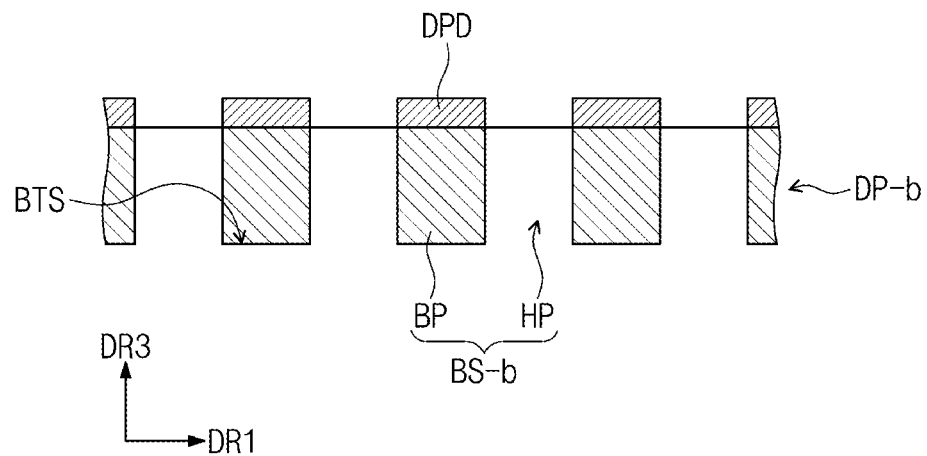
FIG. 15A, 15B, 15C, 15D, 15E, and FIG. 15F are views schematically showing each step of a method of manufacturing a display apparatus according to another embodiment.

FIG. 15A shows the step S100 of providing a display panel including a plurality of panel pads. A display panel DP-b may include the base substrate BS-b and the panel pads DPD, and the panel pads DPD may be disposed on the non-light transmitting portion BP of the base substrate BS-b.

Figure 15B:
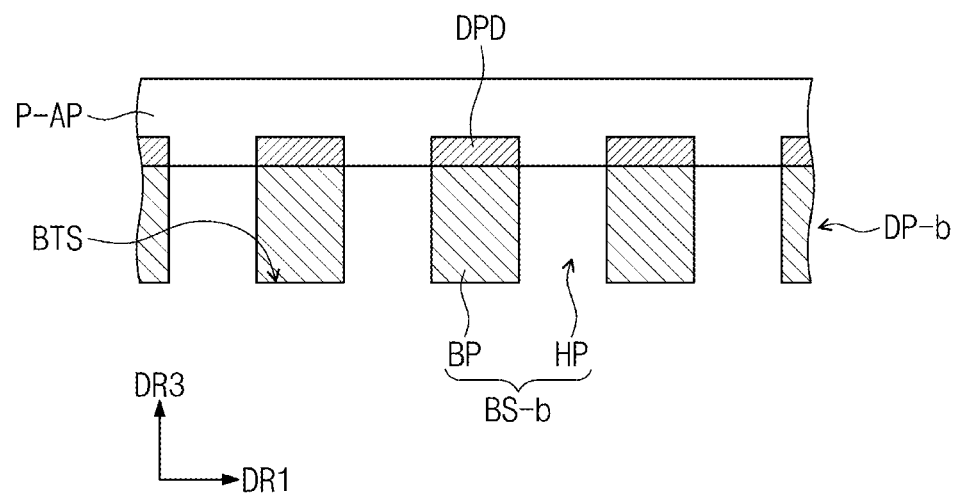

FIG. 15B illustrates the step S200 of providing a preliminary bonding layer covering the panel pads. The preliminary bonding layer P-AP is provided on the display panel DP-b, and may cover the panel pads DPD.

Figure 15C:
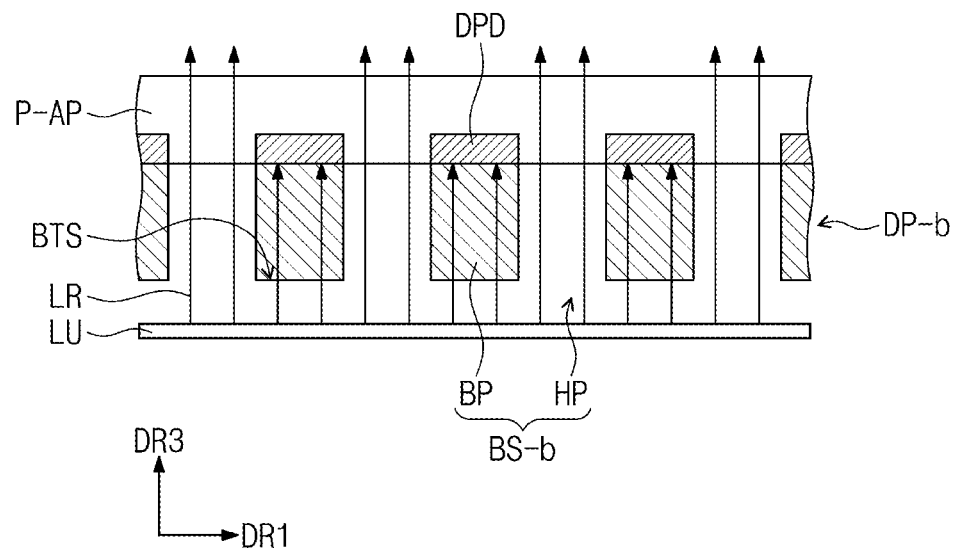
Figure 15D:
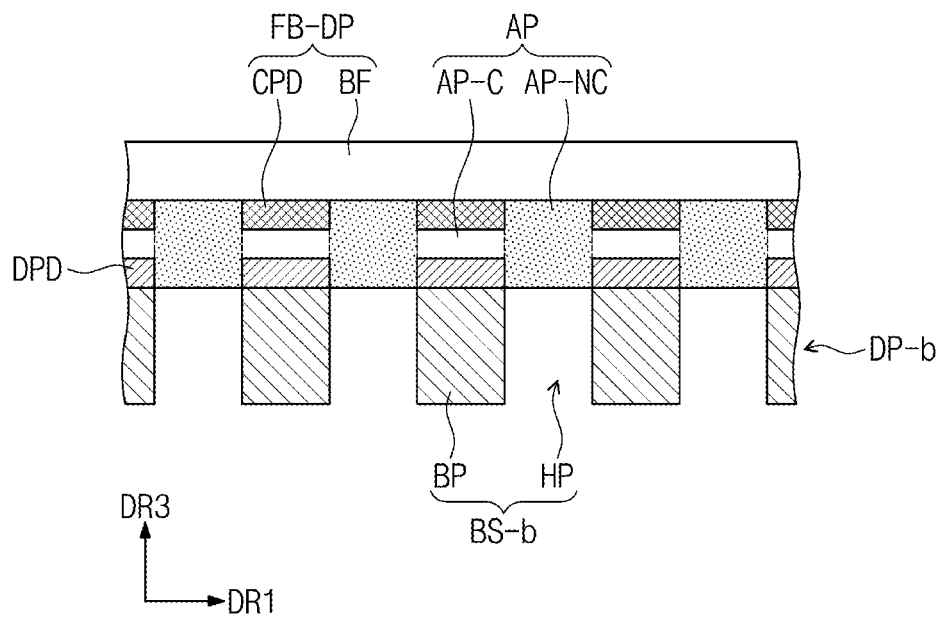

FIG. 15C and FIG. 15D show the step S300 of forming a bonding layer including a conductive portion and a non-conductive portion with irradiating the preliminary bonding layer with a first light, and the step S400 of disposing a flexible circuit board including a plurality of connection pads on the display panel. FIG. 15C illustrates a step of providing the first light LR to the preliminary bonding layer P-AP. FIG. 15D illustrates a step of forming the bonding layer AP including the conductive portion AP-C and the non-conductive portion AP-NC. In addition, FIG. 15D also illustrates a step of disposing the flexible circuit board FB-DP including a plurality of connection pads CPD on the display panel DP-b.

Referring to FIG. 15C, the first light LR provided from the light source LU may be irradiated on the preliminary bonding layer P-AP through the light transmitting portion HP. The first light LR incident on the non-light transmitting portion BP is partially blocked in the non-light transmitting portion BP, and is also blocked in the panel pads DPD, so that the first light LR is not provided to a portion of the preliminary bonding layer P-AP overlapping the panel pads DPD.

Accordingly, as illustrated in FIG. 15D, the bonding layer AP may include the non-conductive portion AP-NC overlapping the light transmitting portion HP of the base substrate BS-b. The conductive portion AP-C is disposed between the non-conductive portions AP-NC, and the conductive portion AP-C may overlap the non-light transmitting portion BP of the base substrate BS-b.

Figure 15E:
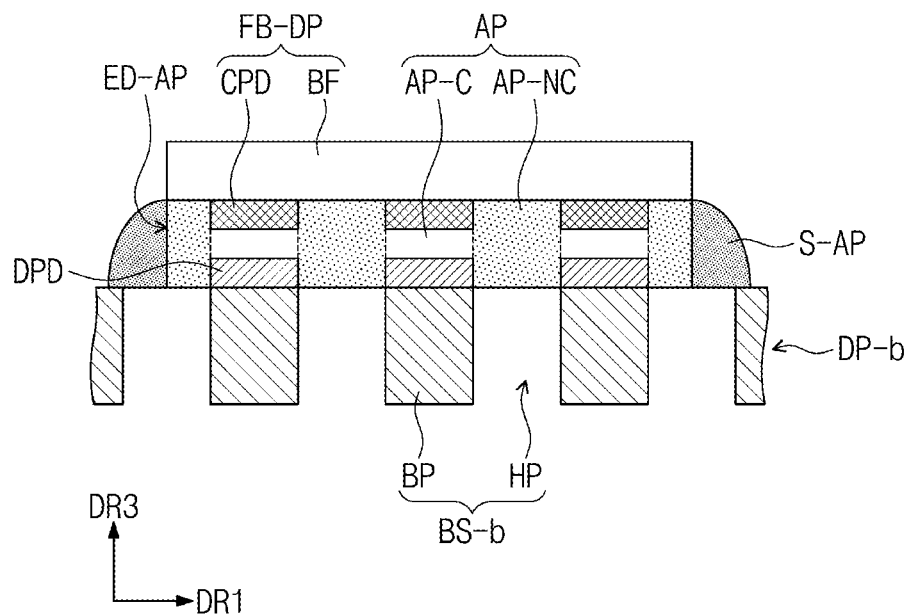

FIG. 15E illustrates the step S500 of providing an auxiliary bonding layer to an edge of the bonding layer. The same contents as those described with reference to FIG. 13F may be applied to the step illustrated in FIG. 15E except that the base substrate BS-b includes the light transmitting portion HP and the non-light transmitting portion BP.

Figure 15F:
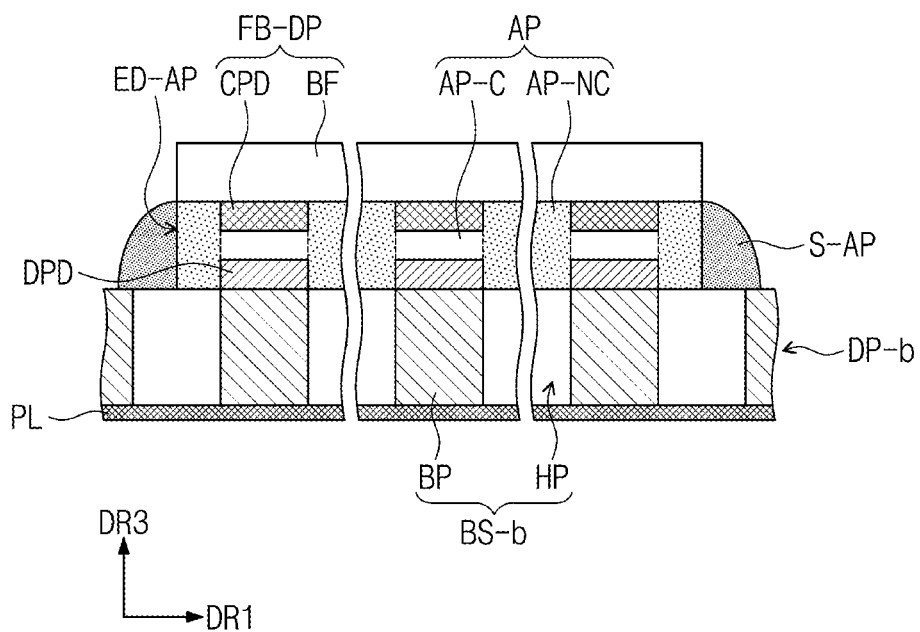

FIG. 15F illustrates a step of providing the protection layer PL on the bottom surface BTS of the base substrate BS-b. The protection layer PL may be provided on the on the bottom surface BTS of the base substrate BS-b after the bonding layer AP is formed.

The manufacturing method of a display apparatus according to an embodiment described with reference to FIG. 15A to FIG. 15F is a manufacturing method of a display apparatus including an opaque base substrate BS-b. When the opaque base substrate BS-b is used, the light transmitting portion HP may be defined on the base substrate BS-b in order to provide the first light LR to the preliminary bonding layer P-AP. Accordingly, in the manufacturing of a display apparatus using the opaque base substrate BS-b as a support member, it is possible to provide a display apparatus having excellent reliability by including the bonding layer AP having the conductive portion AP-C and the non-conductive portion AP-NC which are finely patterned.

A display apparatus according to an embodiment may be implemented to have high resolution and have excellent reliability properties by including a bonding layer having a conductive portion and a non-conductive portion which are finely patterned to have different conductivity values.

A method of manufacturing a display apparatus according to an embodiment may provide a high-resolution display apparatus with improved reliability by including a step of forming a bonding layer having a conductive polymer. A method of manufacturing a display apparatus according to an embodiment may provide a display apparatus with improved reliability by patterning a conductive polymer by a light irradiation method to finely adjust a conductive portion and a non-conductive portion of a bonding layer so as to correspond to a pitch interval of panel pads.

The embodiments relate to a display apparatus and a manufacturing method thereof, wherein the display apparatus includes a conductive polymer bonding layer which couples a display panel and a circuit board. The present invention may provide a display apparatus which implements high resolution and has excellent reliability properties by including a bonding layer having a conductive portion and a non-conductive portion which are finely patterned to have different conductivity values, and thus, has high industrial applicability.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. A display apparatus comprising:
a display panel having a display region and a non-display region, the display panel comprising a plurality of panel pads disposed in the non-display region;
a flexible circuit board comprising a plurality of connection pads overlapping corresponding to the plurality of panel pads; and
a bonding layer disposed between the display panel and the flexible circuit board and including comprising a conductive polymer, wherein the bonding layer comprises:
a plurality of conductive portions overlapping the plurality of panel pads and the plurality of connection pads, the plurality of conductive portions having a first conductivity value; and
a plurality of non-conductive portions not overlapping the plurality of panel pads and the plurality of connection pads, each of the plurality of non-conductive portions fill a space between the display panel and the flexible circuit board, and the plurality of non-conductive portions having a second conductivity value smaller than the first conductivity value.

2. The display apparatus of claim 1, wherein the first conductivity value and the second conductivity value satisfy an equation as below:

(First conductivity value)/(Second conductivity value)≥100.

3. The display apparatus of claim 1, wherein the conductive polymer comprises at least one among polythiophene, poly(3,4-ethylenedioxythiophene), polyaniline, polyacetylene, polydiacetylene, poly(thiophenevinylene), polyfluorene, and polypyrrol.

4. The display apparatus of claim 1, wherein the conductive polymer comprises at least one among poly(3,4-ethylenedioxythiophene): polystyrenesulfonate, poly(3,4-ethylenedioxythiophene): camphor sulfonic acid, poly(3,4-ethylenedioxythiophene): toluene sulfonic acid, poly(3,4-ethylenedioxythiophene): dodecyl benzene sulfonic acid, polyaniline: polystyrenesulfonate, polyaniline: camphor sulfonic acid, polypyrrol: polystyrenesulfonate, polypyrrol: camphor sulfonic acid, polypyrrol: toluene sulfonic acid, polypyrrol: dodecyl benzene sulfonic acid, polythiophene: polystyrenesulfonate, polythiophene: camphor sulfonic acid, polythiophene: toluene sulfonic acid, and polythiophene: dodecyl benzene sulfonic acid.

5. The display apparatus of claim 1, wherein a weight average molecular weight of the conductive polymer in the plurality of conductive portions is larger than a weight average molecular weight of the conductive polymer in the plurality of non-conductive portions.

6. The display apparatus of claim 1, further comprising an input sensing unit disposed on the display panel, the input sensing unit having a sensing region and a non-sensing region neighboring the sensing region,
wherein the input sensing unit comprises a plurality of sensing pads disposed in the non-sensing region.

7. The display apparatus of claim 6, further comprising:
a sensing flexible circuit board comprising a plurality of sensing connection pads overlapping the plurality of sensing pads; and
a sensing bonding layer disposed between the input sensing unit and the sensing flexible circuit board, the sensing bonding layer comprising the conductive polymer, wherein the sensing bonding layer comprises:
a plurality of sensing conductive portions overlapping the plurality of sensing pads and the plurality of sensing connection pads; and
a plurality of sensing non-conductive portions not overlapping the plurality of sensing pads and the plurality of sensing connection pads, the plurality of sensing non-conductive portions having a smaller conductivity value smaller than that of the plurality of sensing conductive portions.

8. The display apparatus of claim 7, wherein a ratio of the conductivity value of the plurality of sensing conductive portions to the conductivity value of the plurality of sensing non-conductive portions is about 100 times or greater.

9. The display apparatus of claim 1, further comprising an auxiliary bonding layer disposed at an edge of the bonding layer.

10. The display apparatus of claim 1, wherein a thickness of each of the plurality of conductive portions is less than a thickness of each of the plurality of non-conductive portions.

11. A display apparatus comprising:
a display panel comprising a base substrate and a plurality of panel pads disposed on one surface of the base substrate;
a flexible circuit board comprising a base film and a plurality of connection pads disposed on one surface of the base film, the plurality of connection pads overlapping the plurality of panel pads; and
a bonding layer disposed between the display panel and the flexible circuit board, the bonding layer comprising a conductive polymer, wherein the bonding layer comprises:
a plurality of conductive portions electrically connecting the plurality of panel pads and the plurality of connection pads; and
a plurality of non-conductive portions disposed between the plurality of conductive portions,
wherein each of the plurality of conductive portions disposed between corresponding respective panel pads and connection pads contact an entire surface of the corresponding respective panel pads and connection pads, and
wherein a weight average molecular weight of the conductive polymer in the plurality of conductive portions is larger than a weight average molecular weight of the conductive polymer in the plurality of non-conductive portions.

12. The display apparatus of claim 11, wherein a first conductivity value of each of the plurality of conductive portions and a second conductivity value of each of the plurality of non-conductive portions satisfy an equation as below:

(First conductivity value)/(Second conductivity value)≥100.

13. The display apparatus of claim 11, wherein:
the plurality of conductive portions overlap the plurality of panel pads and the plurality of connection pads overlapping the plurality of panel pads, and
the plurality of non-conductive portions do not overlap the plurality of panel pads and the plurality of connection pads.

14. The display apparatus of claim 13, wherein the plurality of non-conductive portions fill between the base substrate and the base film.

15. A method of manufacturing a display apparatus, the method comprising the steps of:
providing a display panel including comprising a base substrate and a plurality of panel pads disposed on one surface of the base substrate;
providing a preliminary bonding layer covering the plurality of panel pads on the base substrate;
forming a bonding layer including comprising a conductive portion and a non-conductive portion by irradiating the preliminary bonding layer with a first light; and
disposing a flexible circuit board including comprising a plurality of connection pads on the display panel, wherein:
the conductive portion overlaps the plurality of panel pads and the connection pads corresponding to overlapping the plurality of panel pads and has a first conductivity value, and
the non-conductive portion does not overlap the plurality of panel pads and the plurality of connection pads and has a second conductivity value smaller than the first conductivity value.

16. The method of claim 15, wherein the first light passes through the base substrate using the plurality of panel pads as a mask and is provided to the preliminary bonding layer.

17. The method of claim 15, wherein the first light has a center wavelength of about 250 nm to about 450 nm.

18. The method of claim 15, wherein the bonding layer comprises a conductive polymer comprising at least one among polythiophene, poly(3,4-ethylenedioxythiophene), polyaniline, polyacetylene, polydiacetylene, poly(thiophenevinylene), polyfluorene, and polypyrrol.

19. The method of claim 15, wherein the step of disposing of the flexible circuit board and the step of forming the bonding layer are sequentially performed.

20. The method of claim 15, further comprising the step of disposing an auxiliary bonding layer at an edge of the bonding layer after the step of forming of the bonding layer.

* * * * *